United States Patent
Seko et al.

(10) Patent No.: US 12,035,628 B2
(45) Date of Patent: Jul. 9, 2024

(54) THERMOELECTRIC TRANSDUCER AND THERMOELECTRIC TRANSDUCER MODULE

(71) Applicants: TIANMA JAPAN, LTD., Kanagawa (JP); Akita Prefecture, Akita (JP)

(72) Inventors: Nobuya Seko, Kanagawa (JP); Kazuyuki Ise, Akita (JP)

(73) Assignees: TIANMA JAPAN, LTD., Kanagawa (JP); Akita Prefecture, Akita (JP)

( * ) Notice: Subject to any disclaimer, the term of this patent is extended or adjusted under 35 U.S.C. 154(b) by 0 days.

(21) Appl. No.: 17/843,604

(22) Filed: Jun. 17, 2022

(65) Prior Publication Data

US 2022/0320412 A1 Oct. 6, 2022

Related U.S. Application Data

(62) Division of application No. 17/343,304, filed on Jun. 9, 2021, now abandoned.

(30) Foreign Application Priority Data

Jun. 12, 2020 (JP) ................. 2020-102495

(51) Int. Cl.
*H10N 10/17* (2023.01)
*H10N 10/01* (2023.01)
*H10N 10/81* (2023.01)
*H10N 10/854* (2023.01)

(52) U.S. Cl.
CPC ............. *H10N 10/17* (2023.02); *H10N 10/01* (2023.02); *H10N 10/81* (2023.02); *H10N 10/854* (2023.02)

(58) Field of Classification Search
CPC ...... H10N 10/17; H10N 10/81; H10N 10/854; H10N 10/01
See application file for complete search history.

(56) References Cited

U.S. PATENT DOCUMENTS

| 5,962,854 A | 10/1999 | Endo |
| 2013/0074897 A1 | 3/2013 | Yang et al. |
| 2013/0203201 A1 | 8/2013 | Britton et al. |
| 2015/0023393 A1* | 1/2015 | Britton ............... H01C 7/02 374/185 |

FOREIGN PATENT DOCUMENTS

| JP | 39-31994 Y | 10/1964 |
| JP | 61-30730 A | 2/1986 |
| JP | 8-148727 A | 6/1996 |

(Continued)

OTHER PUBLICATIONS

JP-2016219609-A, Machine Translation, Ise (Year: 2016).*

(Continued)

*Primary Examiner* — Devina Pillay
(74) *Attorney, Agent, or Firm* — Sughrue Mion, PLLC

(57) ABSTRACT

A thermoelectric transducer includes a substrate, a thermoelectric film on the substrate, a first electrode on the substrate, and a second electrode on the substrate, the second electrode being different from the first electrode in work function. The first electrode and the second electrode are in contact with the same side of the thermoelectric film. The outer edge of the thermoelectric film is located inner than the outer edge of the substrate.

3 Claims, 33 Drawing Sheets

(56) References Cited

FOREIGN PATENT DOCUMENTS

| | | | |
|---|---|---|---|
| JP | 2011-44621 A | | 3/2011 |
| JP | 2016-219609 A | | 12/2016 |
| JP | 2016219609 A | * | 12/2016 |
| JP | 2016219609 A | | 12/2016 |
| JP | 2018-159559 A | | 10/2018 |

OTHER PUBLICATIONS

Machine Translation of JP-2011044621.
Machine Translation of JP-2016219609.
Communication dated Feb. 27, 2024 issued by the Japanese Office Action in application No. 2020-102495.

* cited by examiner

COMPARATIVE EXAMPLE

THERMOELECTRIC TRANSDUCER AND THERMOELECTRIC TRANSDUCER MODULE

CROSS-REFERENCE TO RELATED APPLICATIONS

This application is a divisional application of U.S. application Ser. No. 17/343,304 filed Jun. 9, 2021 which is a non-provisional application claiming priority under 35 U.S.C. § 119(a) on Patent Application No. 2020-102495 filed in Japan on Jun. 12, 2020, the entire content of which is hereby incorporated by reference.

BACKGROUND

This disclosure relates to a thermoelectric transducer and a thermoelectric transducer module.

The commonly used thermoelectric generator that utilizes waste heat is a bismuth-telluride ($Bi_2Te_3$)-based Peltier device. JP 2016-219609 A discloses a different type of thermoelectric transducer including a thermoelectric film (semiconductor film) such as an Al-doped zinc oxide (ZnO) film or an Ag-doped magnesium silicide ($Mg_2Si$) film with metal electrodes having different work functions thereon, and a power generation device including the thermoelectric transducer. For example, when a first electrode and a second electrode are connected with a thermoelectric film of an n-type semiconductor, electrons tend to flow in the electrode having a lower work function, rather than the electrode having a higher work function. As a result, thermal electromotive force is generated between the electrodes.

SUMMARY

An aspect of this disclosure is a thermoelectric transducer including: a substrate; a thermoelectric film on the substrate; a first electrode on the substrate; and a second electrode on the substrate, the second electrode being different from the first electrode in work function. The first electrode and the second electrode are in contact with the same side of the thermoelectric film. The outer edge of the thermoelectric film is located inner than the outer edge of the substrate.

Another aspect of this disclosure is a thermoelectric transducer including: a substrate; a thermoelectric film on the substrate; a first electrode on the substrate; and a second electrode on the substrate, the second electrode being different from the first electrode in work function. The first electrode and the second electrode are in contact with the same side of the thermoelectric film. The first electrode includes a first connection terminal part. The second electrode includes a second connection terminal part. The first connection terminal part and the second connection terminal part are distant from the thermoelectric film when viewed planarly.

Another aspect of this disclosure is a thermoelectric transducer module including: a substrate; a thermoelectric film on the substrate; a first electrode on the substrate; a second electrode on the substrate, the second electrode being different from the first electrode in work function; a first lead wire interconnected with a connection terminal part of the first electrode; and a second lead wire interconnected with a connection terminal part of the second electrode. The first electrode and the second electrode are in contact with the same side of the thermoelectric film. A joint between the connection terminal part of the first electrode and the first lead wire, the first lead wire, a joint between the connection terminal part of the second electrode and the second lead wire, and the second lead wire are distant from the thermoelectric film when viewed planarly.

It is to be understood that both the foregoing general description and the following detailed description are exemplary and explanatory and are not restrictive of this disclosure.

EMBODIMENTS

Figure 1:
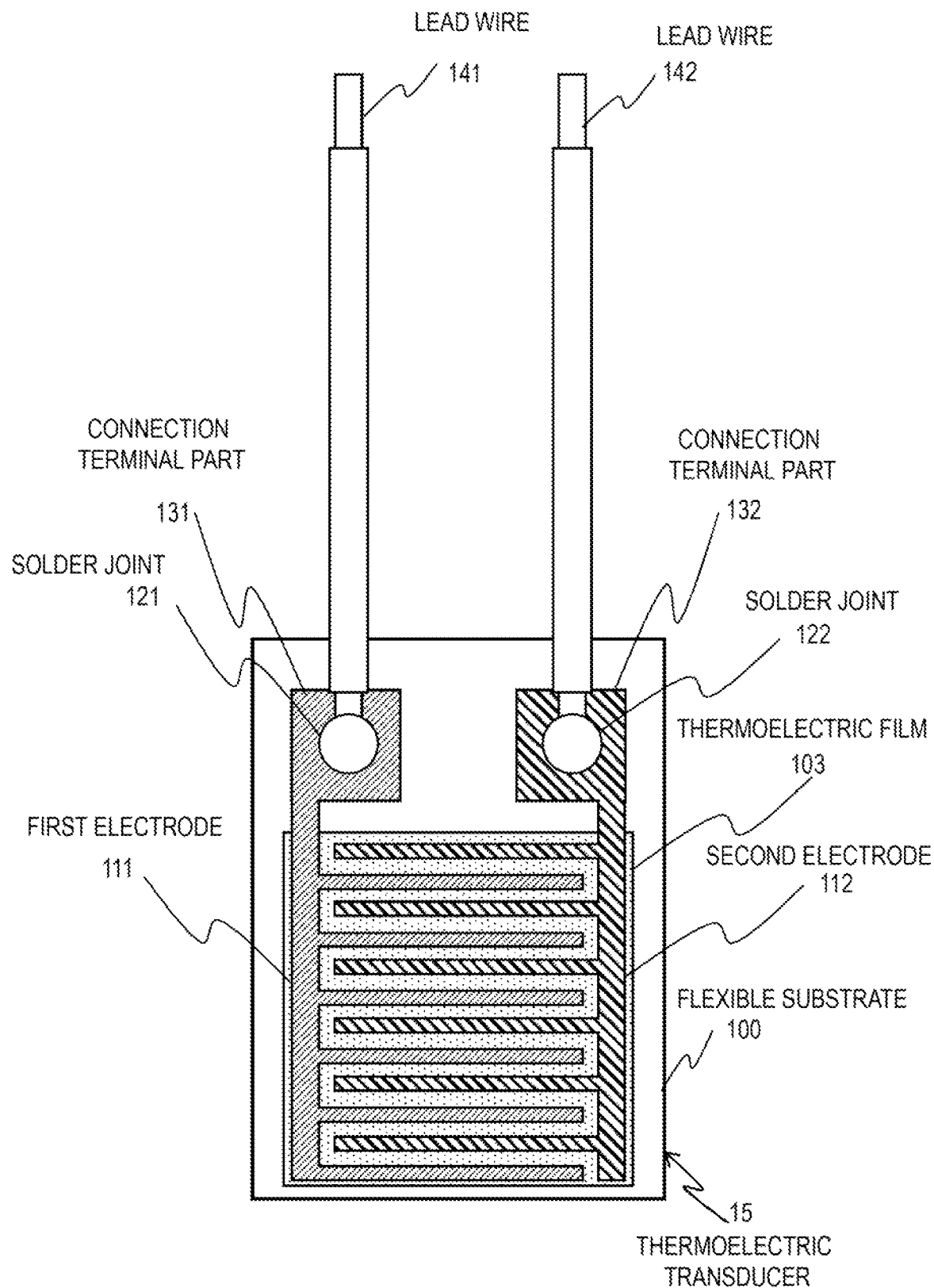
FIG. 1 is a plan diagram of a configuration example of the thermoelectric transducer module in Embodiment 1.

Hereinafter, embodiments will be described specifically with reference to the accompanying drawings. Elements in the drawings may be exaggerated in size and/or shape for clear understanding of the description. Described hereinafter is a thermoelectric transducer that can be used as a sensing device for sensing heat from an object or a power generation device for generating electricity with heat from a heat source. The thermoelectric transducer includes a thermoelectric film, a first electrode, and a second electrode fabricated on a substrate. The first and the second electrodes are laid on the thermoelectric film; the first and the second electrodes are in contact with one side of the thermoelectric film. The thermoelectric transducer can include three or more electrodes.

When temperature difference occurs across the thickness of the thermoelectric film, charge density gradient arises in accordance with the temperature gradient. When the first electrode and the second electrode having different work functions are in contact with the same side of the thermoelectric film, charges move in or move out between each electrode and the thermoelectric film. The mobility of the charges depends on the work function. Accordingly, thermal electromotive force is generated between the two electrodes in response to not only temperature difference occurring in the plane of the thermoelectric film but also temperature difference occurring across the thickness of the thermoelectric film. The difference in thermal electromotive force between the first electrode and the second electrode is taken out as the output of the thermoelectric transducer. To prevent effect of a parasitic device on the output, the thermoelectric element has a structure for preventing generation of the parasitic device.

In an example in this description, the outer edge of the thermoelectric film that contributes to the thermal electromotive force to be output is located inner than the outer edge of the substrate. In other words, the outline of the thermoelectric film is located inner than the outer edge of the principal surface of the substrate when viewed planarly. This configuration prevents generation of a parasitic device because of contact of the thermoelectric film with a conductor such as a heat source or an object to be measured.

In an example of this description, the joint between the first electrode and an external lead wire and the joint between the second electrode and an external lead wire are located outside and distant from the thermoelectric film that contributes to generation of thermal electromotive force. The joints are made of solder or conductive adhesive. The external lead wires are also distant from the thermoelectric film. The joints and the lead wires are not in direct contact with but are distant from the thermoelectric film to avoid generation of parasitic devices at the joints.

In an example of this description, each of the first electrode and the second electrode is one electrode film and includes an electromotive part that is laid on the thermoelectric film and contributes to generation of thermal electromotive force and a connection terminal part for taking out the output to the external. In an example, the connection terminal part is disposed outside the region of the thermoelectric film that contributes to generation of thermal electromotive force. This configuration prevents a lead wire connected with the connection terminal part from contacting the thermoelectric film without being mediated by the connection terminal part and accordingly avoids generation of a parasitic device. The connection terminal part can be laid on a film that is made of the same material as the thermoelectric film that contributes to generation of thermal electromotive force and disposed outside the region of the thermoelectric film.

Embodiment 1

FIG. 1 is a plan diagram of a configuration example of a thermoelectric transducer module in an embodiment of this description. The thermoelectric transducer module includes a thermoelectric transducer 15 and external lead wires (also simply referred to as lead wires) 141 and 142 for transmitting the thermal electromotive force generated in the thermoelectric transducer 15. The lead wires 141 and 142 are interconnected with electrodes of the thermoelectric transducer 15 by solder joints 121 and 122. The thermoelectric transducer module is applicable to a sensing device for sensing heat of an object to be measured or a power generation device that generates electricity with heat from a heat source.

The thermoelectric transducer 15 includes a thermoelectric film 103, a first electrode 111, and a second electrode 112 fabricated on a substrate 100. The thermoelectric transducer 15 can include three or more electrodes. In the configuration example in FIG. 1, the substrate 100 is a flexible substrate made of an organic material such as polyimide. The flexible substrate 100 is made thin (for example 10 µm to 100 µm) for low thermal resistance.

The thermoelectric film 103 can be made of a desirable material that generates a carrier density gradient when a temperature gradient is created in the film. The carriers move to cancel this gradient, so that electromotive force is generated between the electrodes 111 and 112. In the configuration example in FIG. 1, the thermoelectric film 103 is made of a semiconductor material such as In—Ga—Zn—O (IGZO), aluminum-doped ZnO, or silver-doped $Mg_2Si$.

The first electrode 111 and the second electrode 112 are disposed to be separate from each other on the substrate 100. A part of the first electrode 111 and a part of the second electrode 112 are laid on the thermoelectric film 103. These parts of the first electrode 111 and the second electrode 112 are in contact with the same principal surface of the thermoelectric film 103 and the remaining parts are in contact with a principal surface of the substrate 100. The layered area where the electrode 111 or 112 is laid on the thermoelectric film 103 corresponds to the thermal electromotive part for generating electromotive force in accordance with the external heat.

The first electrode 111 and the second electrode 112 have different work functions. The material having a smaller work function can be Cs, Al, or Ti and the material having a larger work function can be Ni or Cu. Any materials can be selected desirably as far as their work functions are different.

The electrode having a smaller work function exhibits higher ohmic characteristic than the electrode having a larger work function when they are in contact with an n-type thermoelectric film. For this reason, more electrons flow from the thermoelectric film 103 into the electrode having the smaller work function. In the case of an p-type thermoelectric film, more holes flow from the thermoelectric film 103 into the electrode having the larger work function. Accordingly, when temperature gradient is present along the normal to the thermoelectric film 103 (in the direction of thickness or layering), the charge potentials at the first electrode 111 and the second electrode 112 become different to generate thermal electromotive force.

Each of the lead wires 141 and 142 includes a conductor for transmitting a signal and a covering surrounding the conductor. The exposed parts of the conductors of the lead wires 141 and 142 are disposed not to overlap the thermoelectric film 103 when viewed planarly. However, if the thermoelectric film 103 is covered with an insulative protection film, these exposed parts can overlap the thermoelectric film 103 when viewed planarly.

Figure 2:
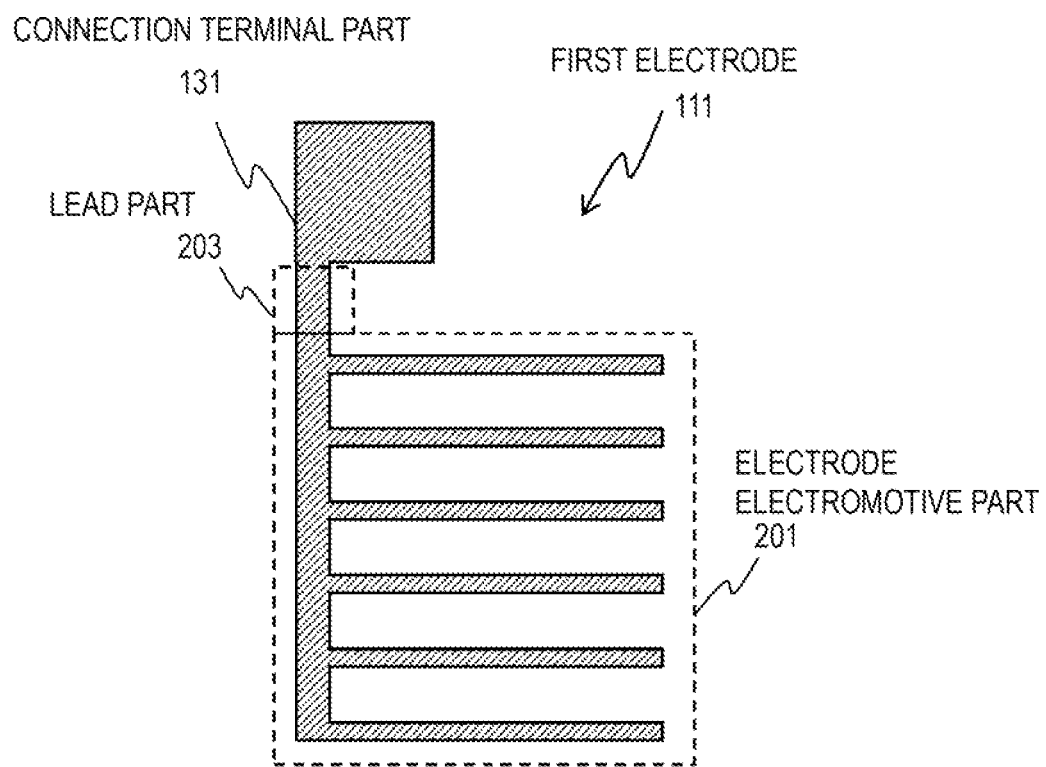
FIG. 2 illustrates a first electrode extracted from the thermoelectric transducer illustrated in FIG. 1.

FIG. 2 illustrates the first electrode 111 extracted from the thermoelectric transducer 15 in FIG. 1. The first electrode 111 is a single metallic thin film and has a plurality of parts. The part surrounded by a broken line 201 is an electromotive part, which is in contact with the thermoelectric film 103 and included in the thermal electromotive part.

The part surrounded by a broken line 203 is a lead part connecting the connection terminal part 131 and the electromotive part. It is located outside the region of the thermoelectric film 103 and is in contact with the substrate 100. The lead part 203 is optional. Although the connection terminal parts 131 and 132 in the configuration example illustrated in FIGS. 1 and 2 have a rectangular shape wider than the lead parts, the shape of the connection terminal parts 131 and 132 is not limited to a specific one.

The configuration such that the connection terminal part 131 for connecting the module to the external and the electromotive part 201 for converting heat to electricity are included in one metallic thin film does not significantly affect the manufacturing process and is effective to take out the output voltage. The second electrode 112 is also a single metallic thin film; it has an electromotive part laid on the thermoelectric film 103 to be included in the thermal electromotive part, and a lead part and a connection terminal part 132 located outside the region of the thermoelectric film 103.

The electromotive parts of the first electrode 111 and the second electrode 112 in the configuration example in FIGS. 1 and 2 have comb-like shapes. Their teeth are disposed to engage with each other. That is to say, the teeth of the first electrode 111 are disposed to be alternate with the teeth of the second electrode 112 in the vertical direction in FIG. 1 so that each tooth of one electrode is opposed to a tooth of the other electrode within a plane. This configuration enables efficient output of thermal electromotive force. The shapes of the electrodes 111 and 112 in FIGS. 1 and 2 are merely an example; the electrodes can have different shapes.

One of the requirements for the thermoelectric transducer 15 is to efficiently transmit external heat or variation in temperature to the thermal electromotive part where the thermoelectric film 103 and the electromotive parts are layered. In the case of using the thermoelectric transducer 15 as a sensing device, this is an important condition to attain high responsiveness. However, the main body composed of thin films of the thermoelectric film 103 and the electrodes 111 and 112 is difficult to maintain its structure by itself; a structure such that the main body is supported by an insulative substrate is effective.

Supposing that the thermoelectric transducer 15 is used in a state where an object is put against the rear surface of the substrate 100, which is the opposite surface of the surface on which the thermoelectric film 103 is provided, the substrate 100 becomes resistive to transmission of heat. Accordingly, reducing the thermal influence by reducing the thermal resistance of the substrate 100 is an approach to efficient transmission of heat to the thermal electromotive part.

It is effective to employ a material having high thermal conductivity for the substrate 100 or to make the substrate 100 thin. However, a thin device including a substrate 100 of a brittle material such as glass has a high possibility of breakage. A substrate made of a polyimide film having a thickness of approximately 10 μm to 100 μm makes the thermoelectric transducer 15 flexible and allows attachment to a curved surface. The thermoelectric transducer 15 is supposed to be used in a high-temperature place and therefore, polyimide is a favorable material. However, the material can be selected from other various substances such as polyethylene terephthalate (PET) resin, liquid polymer (LCP), silicone resin, and epoxy resin in view of the conditions such as the temperature range in the operating environment, the manufacturing method, and the cost.

As illustrates in FIG. 1, the thermoelectric transducer 15 is fabricated so that the outer edge (outline) of the thermoelectric film 103 for contributing to the device operation such as sensing or generating electricity is located inner than the outer edge of the insulative substrate 100. Further, the first electrode 111 includes an integrally formed connection terminal part 131 and the second electrode 112 includes an integrally formed connection terminal part 132 in order to connect the part for contributing to the device operation to the external. The connection terminal parts 131 and 132 are laid neither on nor in contact with the thermoelectric film 103 for contributing to the device operation. This configuration prevents generation of a parasitic device.

Figure 3:
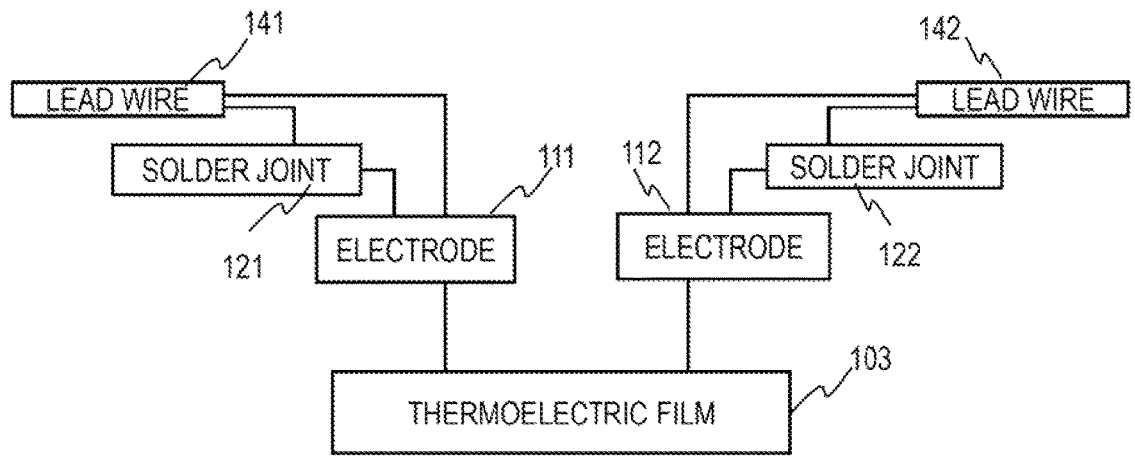
FIG. 3 schematically illustrates the ideal connection of the conductive components in a thermoelectric transducer.

Parasitic devices in the thermoelectric transducer are described. FIG. 3 schematically illustrates the ideal connection of the conductive components in the thermoelectric transducer 15. The solid lines between components represent contacts; the components are in direct contact with each other. The thermoelectric transducer 15 outputs an electromotive force depending on the difference between the work functions of the electrodes that are in contact with the thermoelectric film 103. The conductors in direct contact with the thermoelectric film 103 are only the electrodes 111 and 112; none of the solder joints 121 and 122 and the lead wires 141 and 142 are in contact with the thermoelectric film 103. The thermoelectric film 103 is not in contact with an object such as an object to be measured or a heat source, either.

Figure 4:
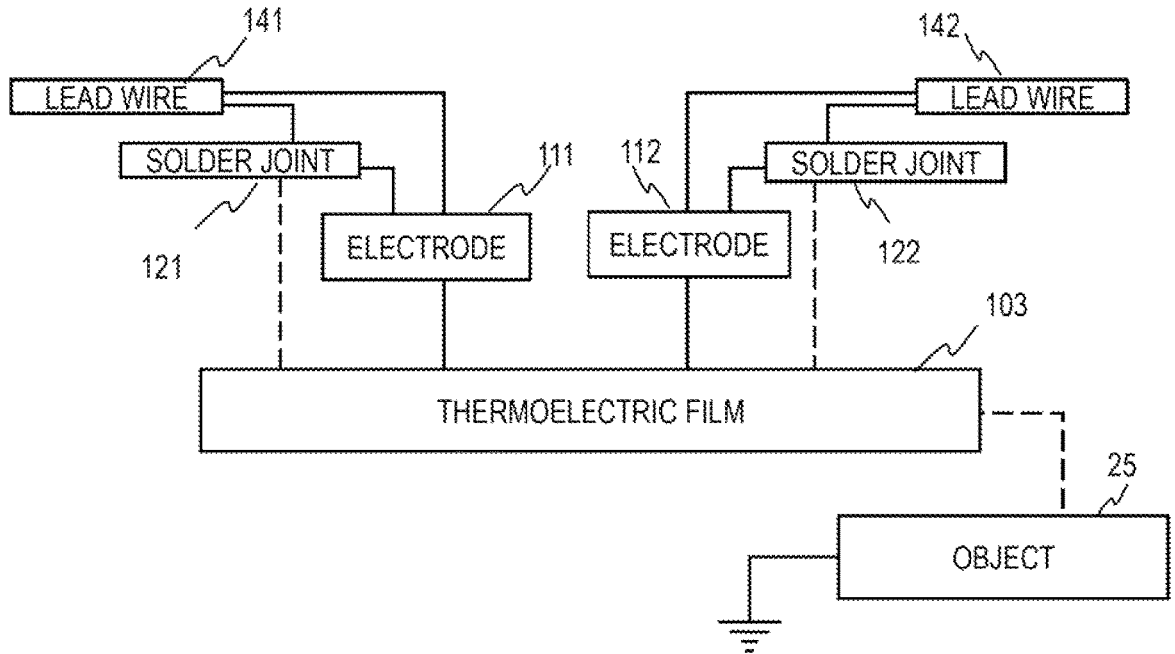
FIG. 4 schematically illustrates a state where parasitic devices are generated.

FIG. 4 schematically illustrates a state where parasitic devices are generated. The solid lines between components represent ideal contacts and the broken lines represent contacts that generate a parasitic device. When a component other than the electrodes 111 and 112, namely a solder joint or a lead wire, is in direct contact with the thermoelectric film 103, a parasitic device is generated.

In most cases, the solder joints 121 and 122 and the lead wires 141 and 142 are made of metallic materials different from the materials of the electrodes 111 and 112. In other words, they are made of materials having work functions different from the work functions of the materials of the electrodes 111 and 112. When one of these is in contact with the thermoelectric film 103 that contributes to generation of thermal electromotive force, a potential different from the potential generated with the electrode 111 or 112 could be generated. This potential is generated in parallel to the potentials properly generated in the thermoelectric device and accordingly, its effect is superimposed on the output. In FIG. 4, the solder joints 121 and 122 are in contact with the thermoelectric film 103 and further, an object 25 such as an object to be measured or a heat source is also in contact with the thermoelectric film 103. Parasitic devices are generated at these components.

Conditions to generate a parasitic device as described above are described. First, the contact between the object 25 and the thermoelectric film 103 is described. A method of manufacturing the thermoelectric transducer 15 produces components of a plurality of thermoelectric transducers 15 by forming electrodes on a thin polyimide film having a thickness of 10 μm to 20 μm by thin-film process such as sputtering or vacuum vapor deposition and depositing a protection film as necessary, and thereafter, cuts out individual thermoelectric transducers 15.

For example, the manufacturing procedure deposits one thermoelectric film on the entire polyimide film, forms a plurality of pairs of electrodes for a plurality of thermoelectric transducers on the thermoelectric film, and covers the thermoelectric film and the electrodes with a polyimide protection film. This protection film has openings to expose the terminals. Since the thermoelectric film is provided on the entire polyimide film, the thermoelectric film is sandwiched between the polyimide substrate and the protection film in the cross-section along the outer edge of the thermoelectric transducer. The polyimide film for a substrate can be formed on a support substrate such as a glass substrate and removed from the support substrate after the foregoing manufacturing procedure is finished.

Since the substrate and the protection film are both very thin (as thin as 10 μm to 20 μm), the thermoelectric film is close to the attachment surface of an object such as an object to be measured or a heat source. Although some methods such as machine processing with a die or a Thomson blade and laser cutting are available to cut out the outline, the thermoelectric film could hang over because of shear droop. For this reason, the thermoelectric film gets closer to the attachment surface at the end of the thermoelectric transducer, increasing the possibility of the electrical contact between an object and the thermoelectric film.

If the object is a conductor, the object is more likely to have some potential. Contact of the object with the thermoelectric film generates a parasitic device, which affects the output of the thermoelectric transducer. In general, the contact that generates a parasitic device is not so reproducible and the contact is not stable in itself. Accordingly, a parasitic device will cause differences in characteristics among a plurality of thermoelectric transducers or instability of output within a thermoelectric transducer. In the structure of this embodiment, the thermoelectric film 103 is distant from the outer edge of the substrate 100 and therefore, when the thermoelectric transducer 15 is attached to an object, the object is less likely to contact thermoelectric film 103.

Next, the contact between the solder joint 121 or 122 and the thermoelectric film 103 is described. In connecting a lead wire to a connection terminal part by soldering, the solder produces a diffusion layer with the electrode layer to be connected. The electrode layer is formed by thin-film process and is as thin as approximately dozens of nanometers to one micrometer. Part of the solder may penetrate the electrode layer of the connection terminal part, so that the solder (and the lead wire) could contact the thermoelectric film 103 directly.

The operation of the thermoelectric transducer 15 is based on the balance of the mobility of charges at the interfaces of the electrodes 111 and 112 with the thermoelectric film 103. Accordingly, an unexpected parasitic device between the thermoelectric film 103 and the solder joint 121 or 122 or the lead wire 141 or 142 causes unexpected effect on the output. The extent of the effect differs depending on the area of the solder that is in contact with the thermoelectric film through an electrode, causing variation in characteristics.

To eliminate the effect of a parasitic device, it is effective that the thermoelectric transducer 15 has a structure not to produce a contact to generate a parasitic device. If a conductor other than the electrodes 111 and 112 may contact the thermoelectric film 103, processing by removing a part of the thermoelectric film 103 is effective to prevent the contact.

As described above, a configuration such that the outer edge of the thermoelectric film 103 is located inner than the outer edge of the substrate 100 reduces the possibility that an object contacts the thermoelectric film 103 at the end of the thermoelectric transducer 15. Further, a disposition such that the connection terminal parts 131 and 132 of the electrodes 111 and 112 are not in contact with but are distant from the thermoelectric film 103 on the substrate 100 effectively prevents generation of a parasitic device because of contact of the solder joint 121 or 122 or the lead wire 141 or 142 with the thermoelectric film 103.

Figure 5A:
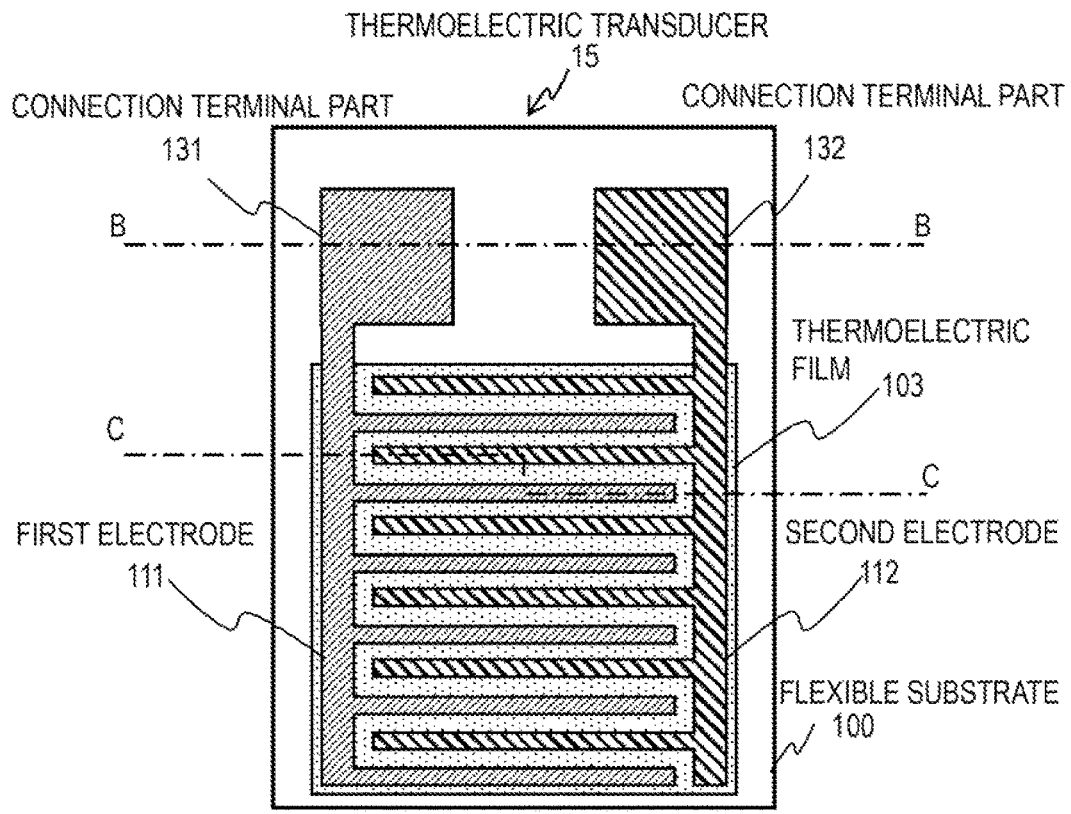
FIG. 5A is a plan diagram of a thermoelectric transducer.
Figure 5B:
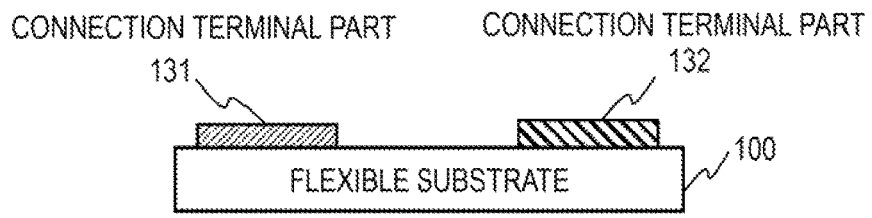
FIG. 5B schematically illustrates the cross-sectional structure along the section line B-B in FIG. 5A.
Figure 5C:
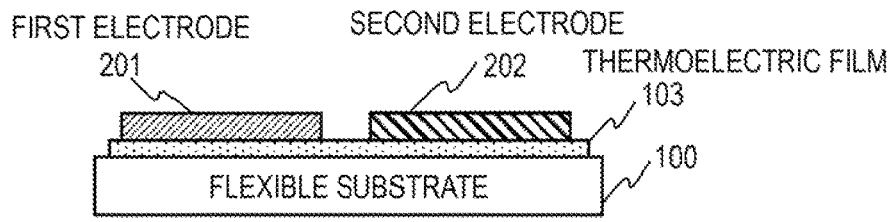
FIG. 5C schematically illustrates the cross-sectional structure along the section line C-C in FIG. 5A.

Hereinafter, the cross-sectional structure of the thermoelectric transducer 15 is described. FIG. 5A is a plan diagram of a thermoelectric transducer 15. FIG. 5B schematically illustrates the cross-sectional structure along the section line B-B in FIG. 5A. FIG. 5C schematically illustrates the cross-sectional structure along the section line C-C in FIG. 5A. FIG. 5B illustrates a cross-section of a part including the connection terminal parts 131 and 132 of the thermoelectric transducer 15. FIG. 5C illustrates a cross-section of a part including the electromotive parts 201 and 202 of the electrodes 111 and 112 of the thermoelectric transducer 15. The electromotive parts 201 and 202 are laid on the thermoelectric film 103 and included in the thermal electromotive part.

As illustrated in FIG. 5B, the connection terminal parts 131 and 132 are in contact with one side of the substrate 100 and located outside the region of the thermoelectric film 103 within this side of the substrate. Since the connection terminal parts 131 and 132 are distant from the thermoelectric film 103 when viewed planarly, this configuration prevents contact of the solder joint 121 or 122 or the lead wire 141 or 142 to the thermoelectric film 103 to generate a parasitic device.

As illustrated in FIG. 5C, the part 201 of the first electrode 111 and the part 202 of the second electrode 112 are laid on and in contact with the thermoelectric film 103. Accordingly, thermal electromotive force is generated between the first electrode 111 and the second electrode 112. In the example in FIGS. 5B and 5C, the thermoelectric film 103 and the connection terminal parts 131 and 132 are provided above and in contact with the substrate 100. In another example, interlayer films of an inorganic insulator can be provided between the thermoelectric film 103 and the substrate 100 and between the connection terminal parts 131 and 132 and the substrate 100.

Figure 6:
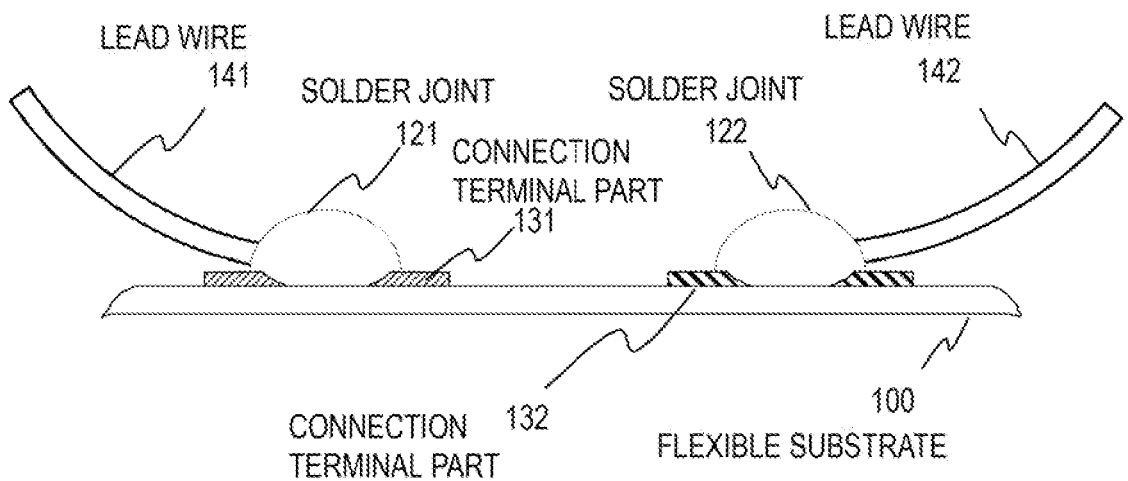
FIG. 6 illustrates a configuration example of the joint between a lead wire and a connection terminal part.
Figure 7:
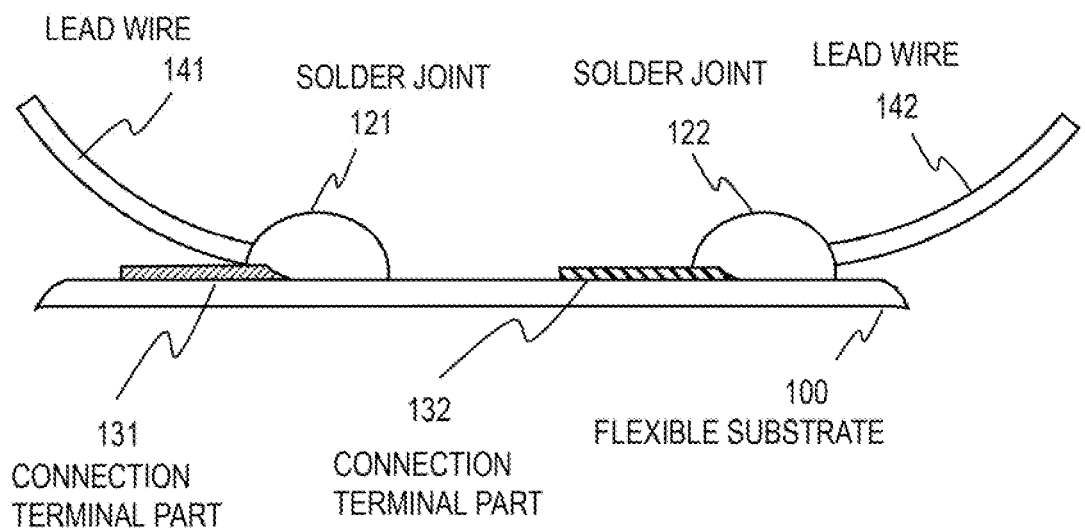
FIG. 7 illustrates another configuration example of the joint between a lead wire and a connection terminal part.

FIGS. 6 and 7 illustrate configuration examples of the joint between a lead wire and a connection terminal part. Even if the solder joint 121 or 122 penetrates the connection terminal part 131 or 132 as illustrated in FIG. 6, none of the solder joints 121 and 122 and the lead wires 141 and 142 contact the thermoelectric film 103.

Even if soldering is dislocated from the connection terminal part as illustrated in FIG. 7, none of the solder joints 121 and 122 and the lead wires 141 and 142 contact the thermoelectric film 103. As noted from these examples, the structure in this embodiment prevents generation of an undesirable parasitic device, so that the thermoelectric transducer 15 exhibits stable characteristics.

Figure 8:
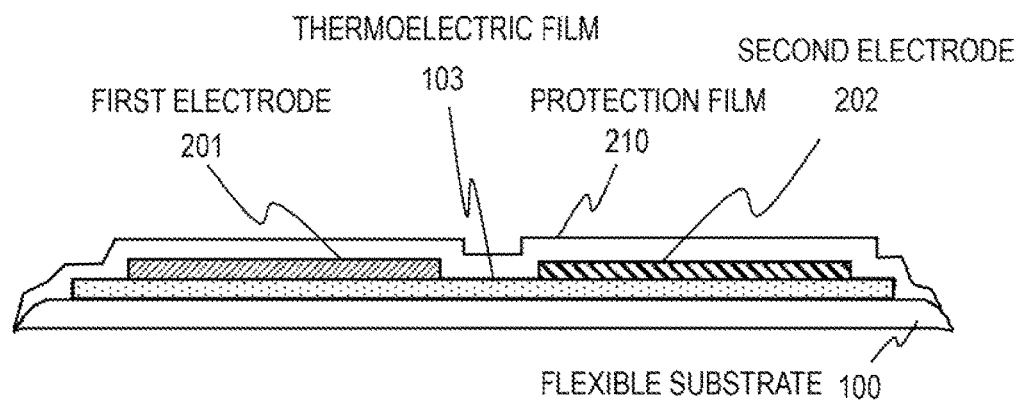
FIG. 8 schematically illustrates a cross-section of another configuration example of the thermoelectric transducer.

FIG. 8 schematically illustrates a cross-section of another configuration example of the thermoelectric transducer 15. The configuration example illustrated in FIG. 8 includes an insulative protection film 210 covering the components. The protection film 210 has not-shown openings and the connection terminal parts 131 and 132 are exposed through the openings. The protection film 210 can be made of an insulative organic substance such as polyimide. The protection film 210 prevents electric contact of an external object to any of the electrodes 111 and 112 and the thermoelectric film 103.

Figure 9:
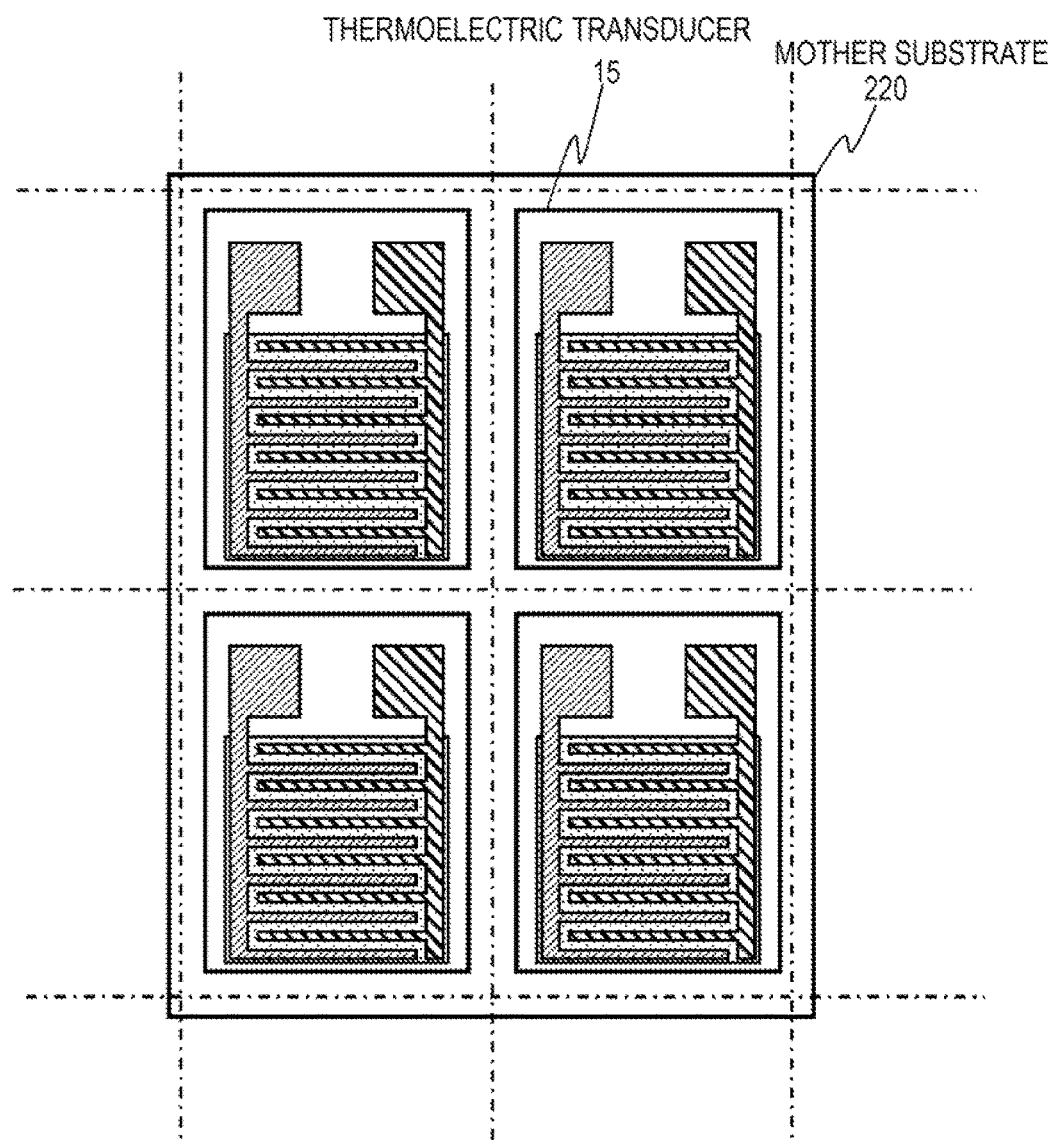
FIG. 9 schematically illustrates thermoelectric transducers before being cut out from a mother substrate.

Hereinafter, an example of the method of manufacturing the thermoelectric transducer 15 in Embodiment 1 is described. FIG. 9 schematically illustrates thermoelectric transducers 15 before being cut out from a mother substrate 220. The dashed-dotted lines represent the cut lines to cut out the thermoelectric transducers 15. As described above, the thermoelectric transducers 15 are cut out from the mother substrate 220 by machine processing or laser cutting.

The thermoelectric transducer 15 is manufactured by thin-film process. The cost of manufacture by thin-film process can be lowered by increasing the number of transducers to be simultaneously fabricated on one mother substrate 220 as illustrated in FIG. 9.

A method that fabricates a structure of the thermoelectric transducer for achieving the required function by thin-film process, manufactures the other parts such as lead wires by an independent low-cost method, and joins them is an effective choice. This embodiment fabricates the structure for generating thermal electromotive force and connection terminal parts to be connected with lead wires for taking out the output to the external by thin-film process.

An example of the manufacturing procedure forms a polyimide film on a glass substrate, deposits the other components of thermoelectric transducers on the polyimide film, and removes the glass substrate from the polyimide film before or after cutting out the thermoelectric transducers 15. In the following, such an example of the manufacturing procedure is described with reference to plan diagrams and cross-sectional diagrams. The following description is about a manufacturing procedure for one thermoelectric transducer 15 but the actual manufacture fabricates a number of horizontally and vertically arrayed structures together and separates the structures in a later step. The thin-film process and the separation can be performed in a different order from the one described in the following.

Figure 10A:
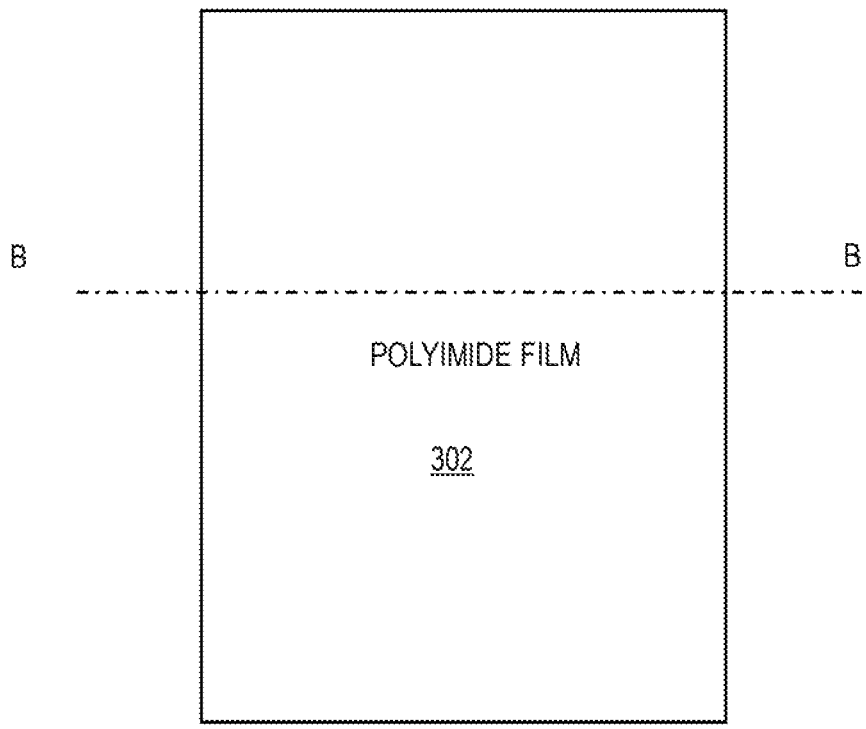
FIG. 10A is a plan diagram of a structure in manufacturing a thermoelectric transducer.
Figure 10B:
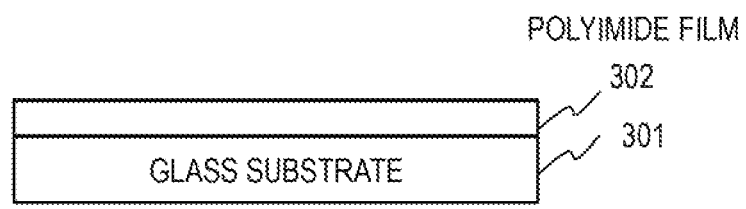
FIG. 10B schematically illustrates the cross-sectional structure along the section line B-B in FIG. 10A.

FIGS. 10A and 10B are a plan diagram and a cross-sectional diagram of the structure after the first step. The cross-sectional diagram of FIG. 10B illustrates the cross-section along the section line B-B in FIG. 10A. This step applies a polyimide film 302 onto a glass substrate 301 and cures it. In another example, a polyimide film 302 can be bonded to a glass substrate 301.

Figure 11A:
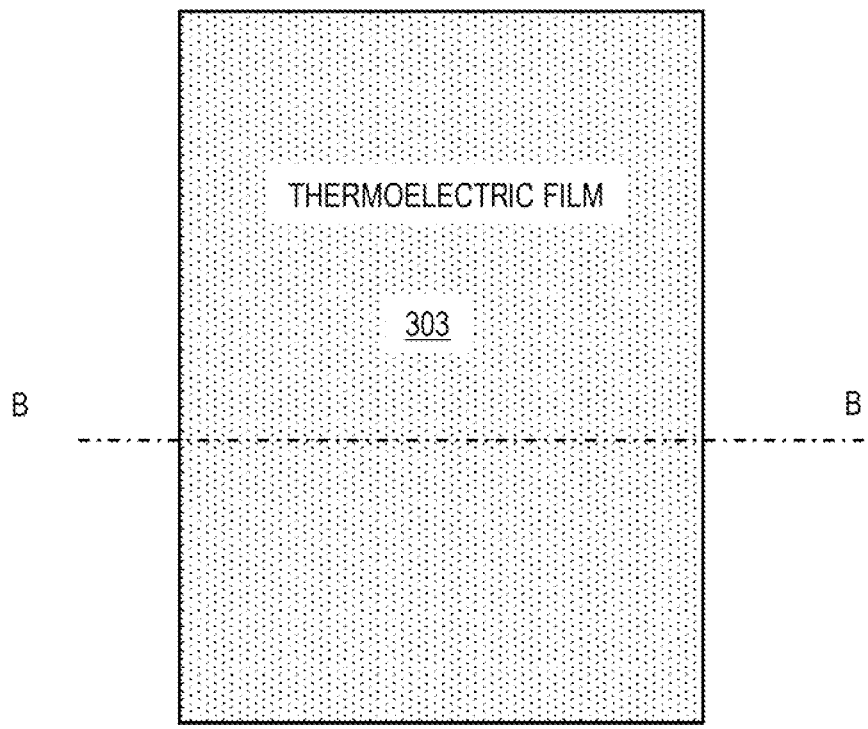
FIG. 11A is a plan diagram of a structure in manufacturing a thermoelectric transducer.
Figure 11B:
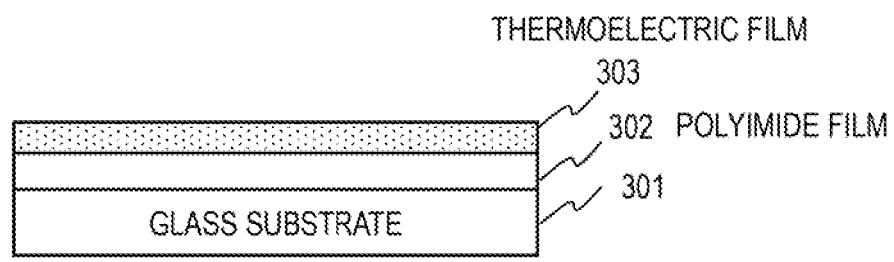
FIG. 11B schematically illustrates the cross-sectional structure along the section line B-B in FIG. 11A.

FIGS. 11A and 11B are a plan diagram and a cross-sectional diagram of the structure after the next step. The cross-sectional diagram of FIG. 11B illustrates the cross-section along the section line B-B in FIG. 11A. This step deposits a thermoelectric film 303 on the polyimide film 302. For the thermoelectric film 303, an IGZO film can be deposited by sputtering. A different film formation method and/or a different material can be selected.

Figure 12A:
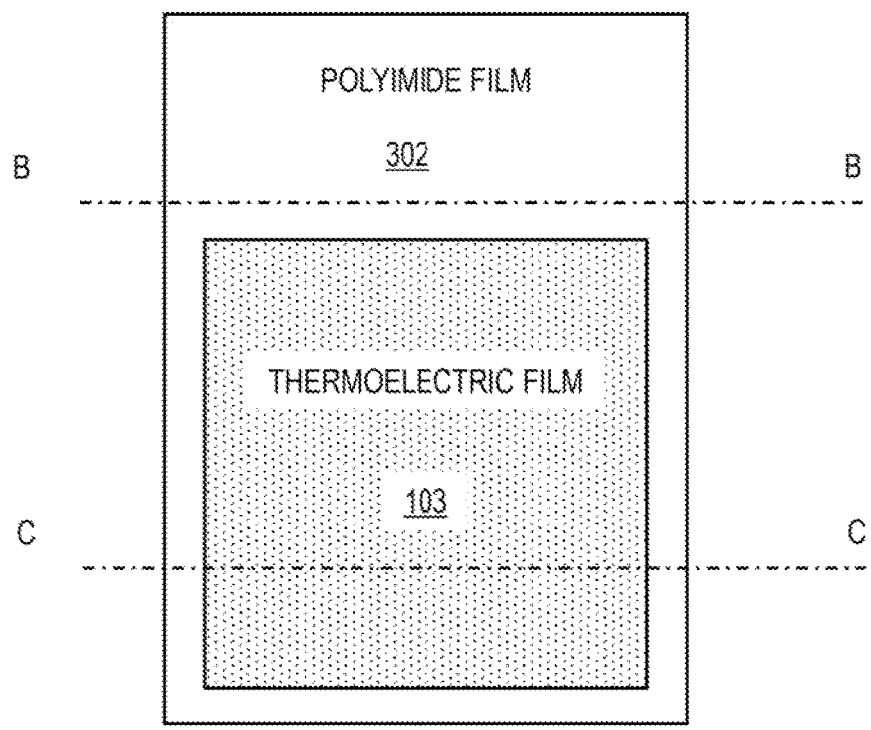
FIG. 12A is a plan diagram of a structure in manufacturing a thermoelectric transducer.
Figure 12B:
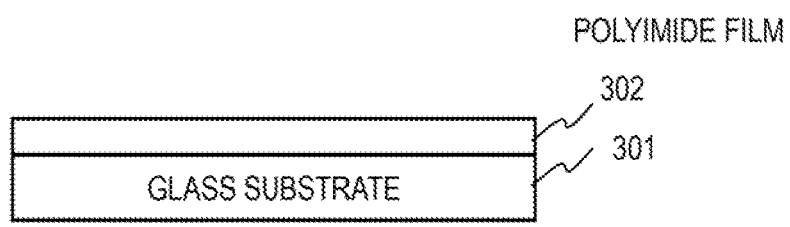
FIG. 12B schematically illustrates the cross-sectional structure along the section line B-B in FIG. 12A.
Figure 12C:
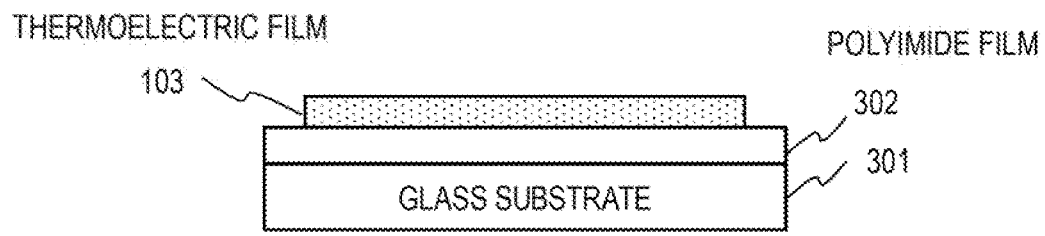
FIG. 12C schematically illustrates the cross-sectional structure along the section line C-C in FIG. 12A.

FIGS. 12A, 12B, and 12C are a plan diagram and two cross-sectional diagrams of the structure after the next step. This step removes a part of the thermoelectric film 303 to form a thermoelectric film 103. The cross-sectional diagram of FIG. 12B illustrates the cross-section along the section line B-B in FIG. 12A, which is a cross-section of the area where the thermoelectric film is removed. The cross-sectional diagram of FIG. 12C illustrates the cross-section along the section line C-C in FIG. 12A, which is a cross-section of the area where the thermoelectric film 103 exists. The thermoelectric film can be processed by photolithography and etching. In another example, a metal mask is used to deposit the thermoelectric film 303, which corresponds to simultaneously depositing and patterning a thermoelectric film 103 having a desired shape.

Figure 13A:
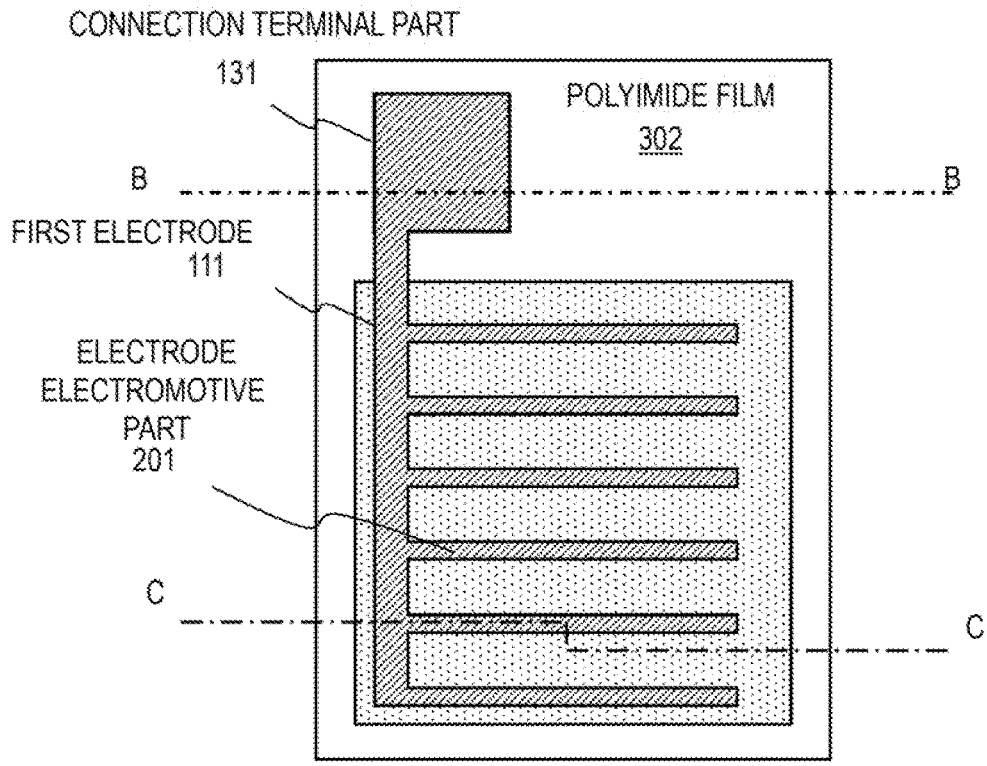
FIG. 13A is a plan diagram of a structure in manufacturing a thermoelectric transducer.
Figure 13B:
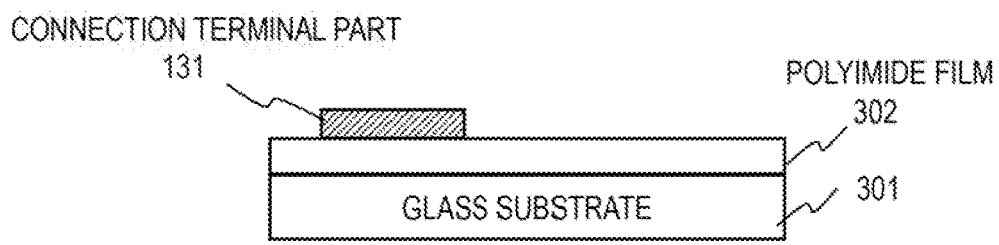
FIG. 13B schematically illustrates the cross-sectional structure along the section line B-B in FIG. 13A.
Figure 13C:
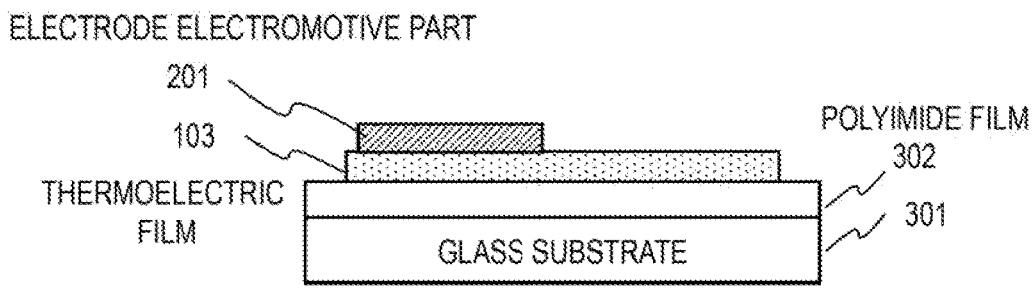
FIG. 13C schematically illustrates the cross-sectional structure along the section line C-C in FIG. 13A.

FIGS. 13A, 13B, and 13C are a plan diagram and two cross-sectional diagrams of the structure after the next step. This step produces a first electrode 111. The cross-sectional diagram of FIG. 13B illustrates the cross-section along the section line B-B in FIG. 13A, which is a cross-section of the area where a connection terminal part 131 is formed. The cross-sectional diagram of FIG. 13C illustrates the cross-section along the section line C-C in FIG. 13A, which is a cross-section of the area where an electromotive part 201 is formed. The first electrode 111 can be produced by sputtering or vacuum vapor deposition with a metal mask or by photolithography and etching following full film formation on a side of the substrate.

Figure 14A:
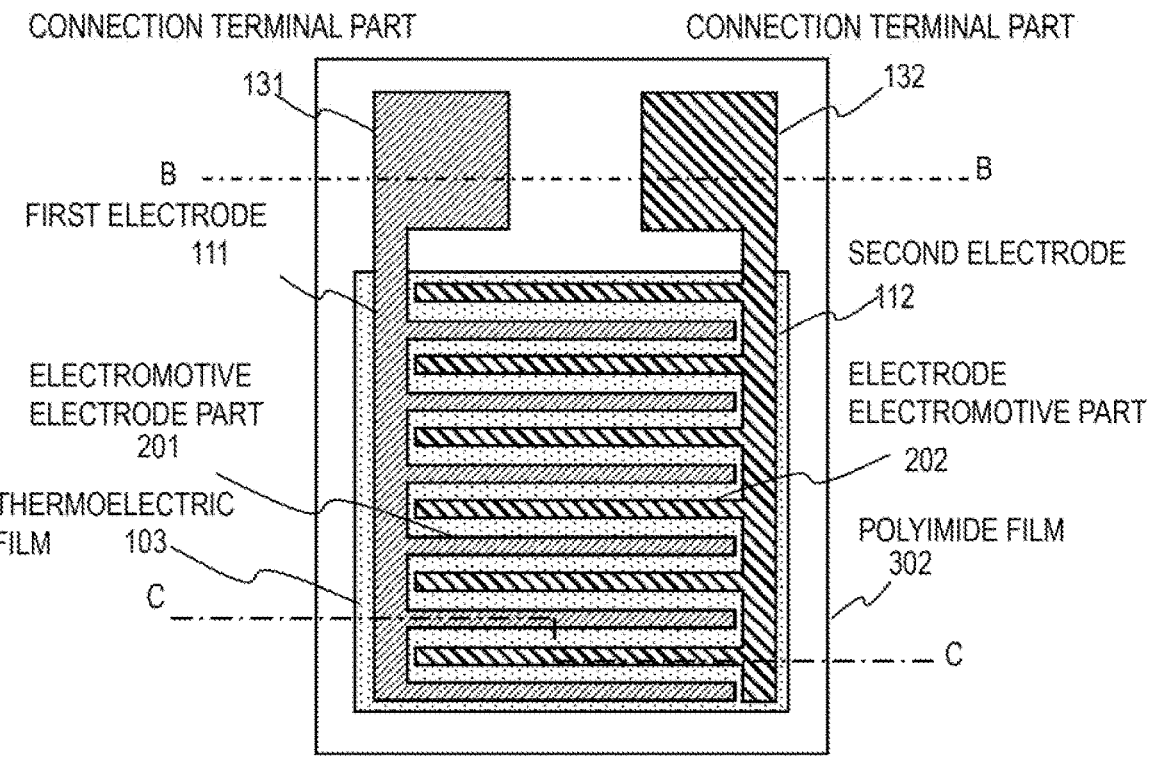
FIG. 14A is a plan diagram of a structure in manufacturing a thermoelectric transducer.
Figure 14B:
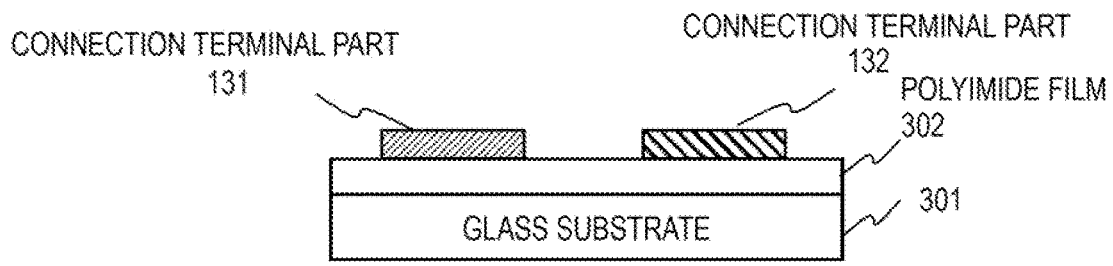
FIG. 14B schematically illustrates the cross-sectional structure along the section line B-B in FIG. 14A.
Figure 14C:
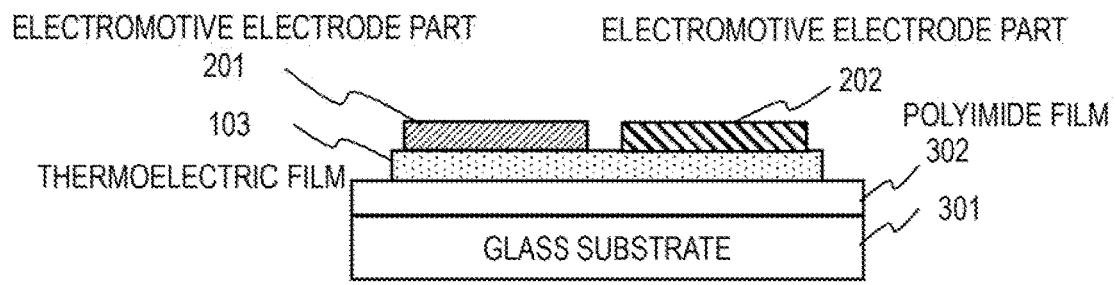
FIG. 14C schematically illustrates the cross-sectional structure along the section line C-C in FIG. 14A.

FIGS. 14A, 14B, and 14C are a plan diagram and two cross-sectional diagrams of the structure after the next step. This step produces a second electrode 112. The cross-sectional diagram of FIG. 14B illustrates the cross-section along the section line B-B in FIG. 14A, which is a cross-section of the area where a connection terminal part 132 is formed. The cross-sectional diagram of FIG. 14C illustrates the cross-section along the section line C-C in FIG. 14A, which is a cross-section of the area where an electromotive part 202 is formed. The second electrode 112 can be produced by the same method as the first electrode 111. Either the first electrode 111 or the second electrode 112 can be produced first.

After the steps described with reference to FIGS. 10A to 14C, individual thermoelectric transducers 15 are cut out, lead wires are connected to the connection terminals 131 and 132, and the glass substrate 301 is removed. The order of these steps can be selected desirably. The lead wires 141 and 142 can be soldered to the connection terminal parts 131 and 132 after pre-tinning the connection terminals 131 and 132 by ultrasonic soldering and pre-tinning the lead wires 141 and 142. A different soldering procedure can be employed.

As described above, the first electrode 111 and the second electrode 112 need to be made of materials having different work functions. Since effective acquisition of a thermal electromotive force is prioritized first, the soldering material could have poor adhesion to the material of the first electrode and/or the second electrode. To address this issue, a not-shown thin film of a metal having good solderability, such as copper, gold, or tin, can be laid on the connection terminal parts 131 and 132 of the first electrode 111 and the second electrode 112.

The lead wire can be not only an electrical wire but also flexible printed circuits (FPC). The FPC can be connected to a connection terminal by pre-tinning the both sides to be joined, putting the FPC on the connection terminal part, and joining them by thermocompression bonding. The polyimide film can be removed from the glass substrate by laser lift-off (LLO), which irradiates the rear surface of the glass substrate with a laser beam to detach the polyimide film by the effect of light or heat. The soldering method of the lead wire to the connection terminal part and the method of removing the polyimide film from the glass substrate can be selected desirably.

Embodiment 2

Figure 15:
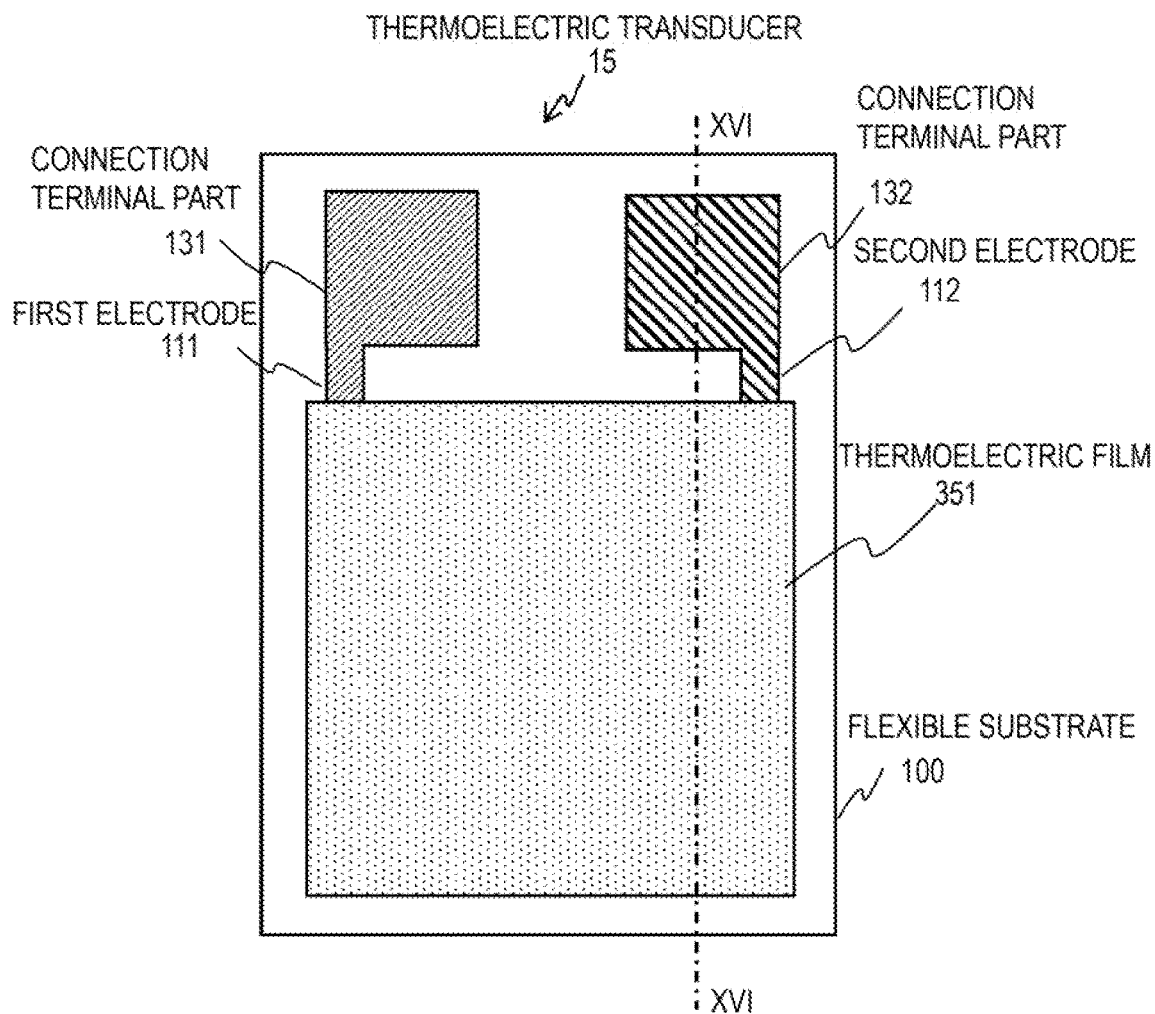
FIG. 15 is a plan diagram of a configuration example of the thermoelectric transducer in Embodiment 2.
Figure 16:
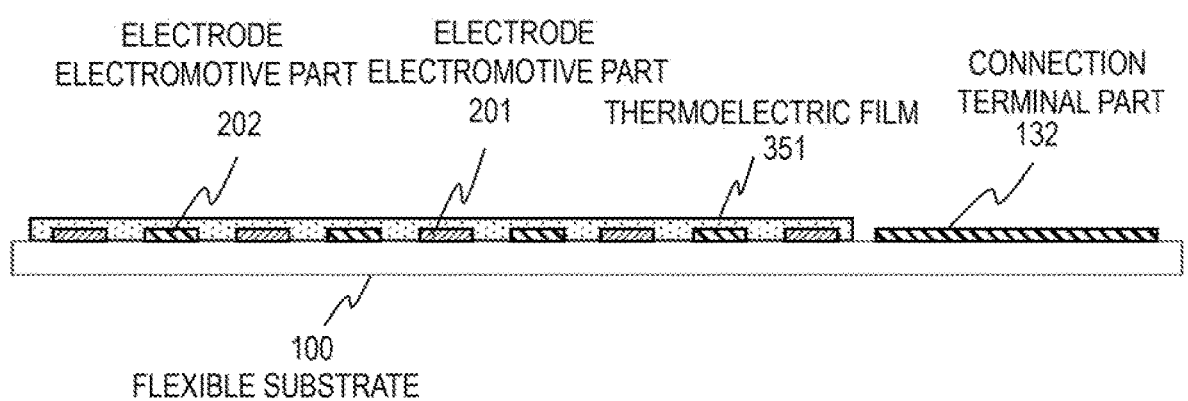
FIG. 16 is a cross-sectional diagram along the section line XVI-XVI in FIG. 15.

Embodiment 1 provides a structure such that a plurality of electrodes are disposed on the same side of a thermoelectric film. This structure allows the layers of the thermoelectric film and the electrodes to be replaced with each other. FIGS. 15 and 16 illustrate a configuration example of a thermoelectric transducer 15 including a thermoelectric film and electrodes layered in a different order from those in Embodiment 1. FIG. 16 is a cross-sectional diagram along the section line XVI-XVI in FIG. 15. This configuration is the same as the configuration in Embodiment 1 except that the order of layers of the thermoelectric film and the electrodes is different.

As illustrated in FIGS. 15 and 16, the thermoelectric film 351 is laid above the electromotive parts 201 and 202 of the first electrode 111 and the second electrode 112 to cover them. The outer edge of the thermoelectric film 351 is located inner than the outer edge of the substrate 100. The connection terminal parts 131 and 132 are disposed outside the region of the thermoelectric film 351 and exposed.

Hereinafter, an example of the manufacturing procedure is described with reference to plan diagrams and cross-sectional diagrams. The following description is about a manufacturing procedure for one thermoelectric transducer 15 but the actual manufacture fabricates a number of horizontally and vertically arrayed structures together and separates the structures in a later step. The thin-film process and the separation can be performed in a different order from the one described in the following.

Figure 17A:
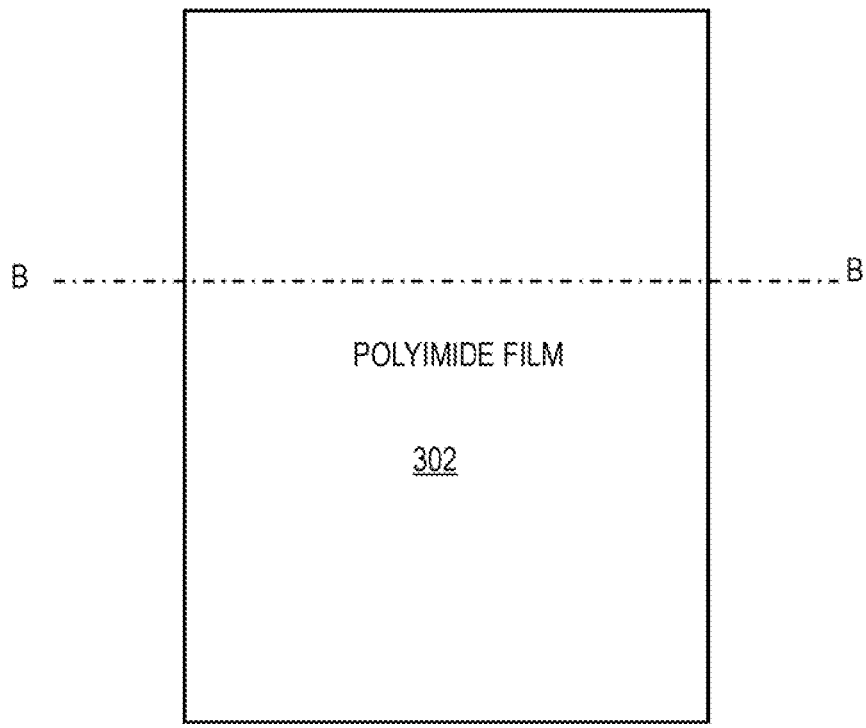
FIG. 17A is a plan diagram of a structure in manufacturing a thermoelectric transducer.
Figure 17B:
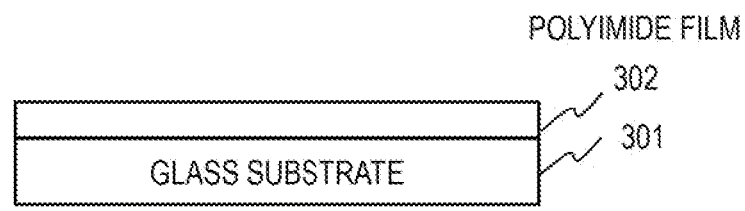
FIG. 17B schematically illustrates the cross-sectional structure along the section line B-B in FIG. 17A.

FIGS. 17A and 17B are a plan diagram and a cross-sectional diagram of the structure after the first step. The cross-sectional diagram of FIG. 17B illustrates the cross-section along the section line B-B in FIG. 17A. This step deposits a polyimide film 302 on a glass substrate 301, like in Embodiment 1.

Figure 18A:
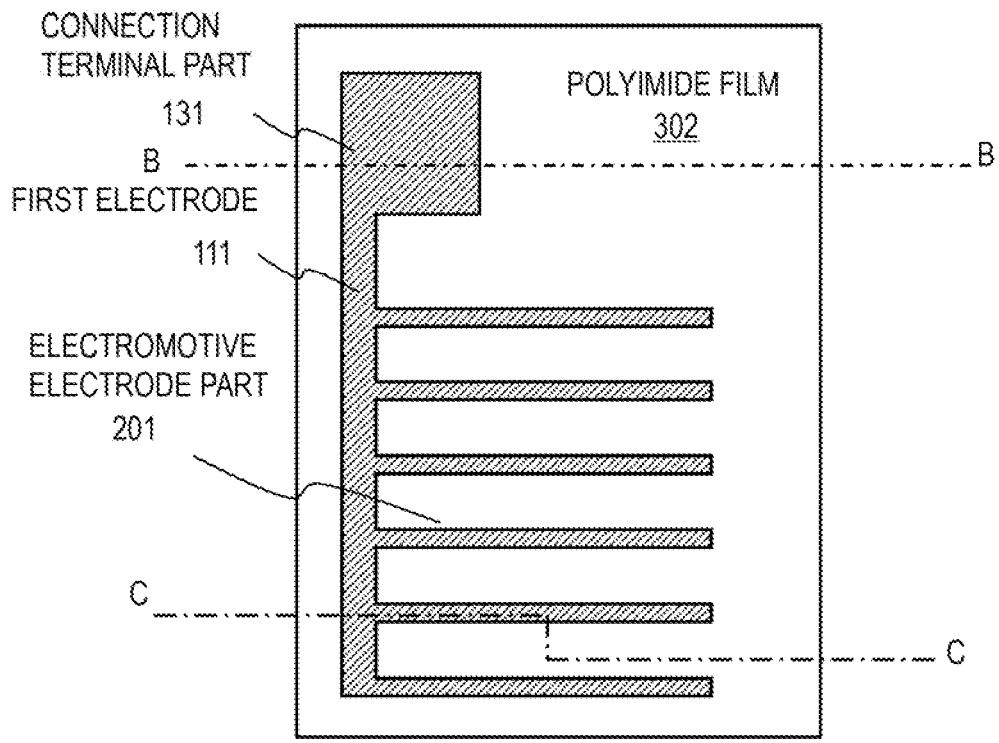
FIG. 18A is a plan diagram of a structure in manufacturing a thermoelectric transducer.
Figure 18B:
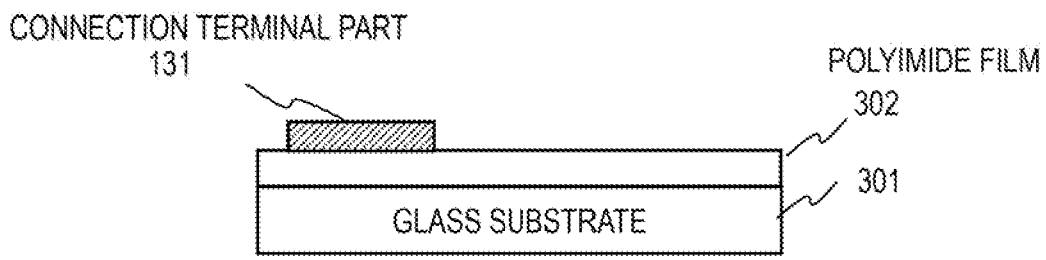
FIG. 18B schematically illustrates the cross-sectional structure along the section line B-B in FIG. 18A.
Figure 18C:
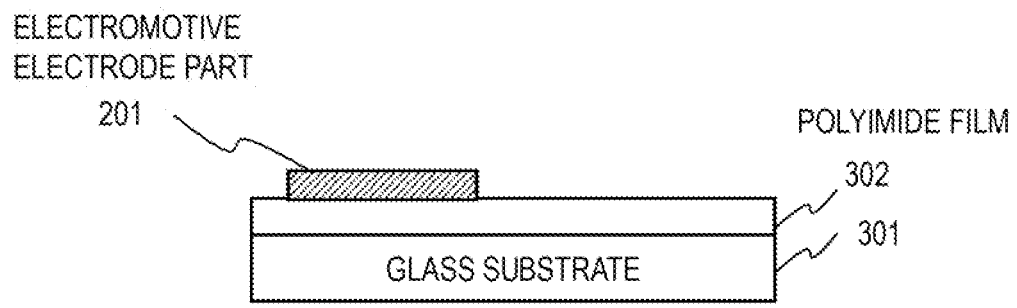
FIG. 18C schematically illustrates the cross-sectional structure along the section line C-C in FIG. 18A.

FIGS. 18A, 18B, and 18C are a plan diagram and two cross-sectional diagrams of the structure after the next step. This step produces a first electrode 111. The cross-sectional diagram of FIG. 18B illustrates the cross-section along the section line B-B in FIG. 18A, which is a cross-section of the area where a connection terminal part 131 is formed. The cross-sectional diagram of FIG. 18C illustrates the cross-section along the section line C-C in FIG. 18A, which is a cross-section of the area where an electromotive part 201 is formed. The first electrode 111 can be produced by etching, or patterning by photolithography.

Figure 19A:
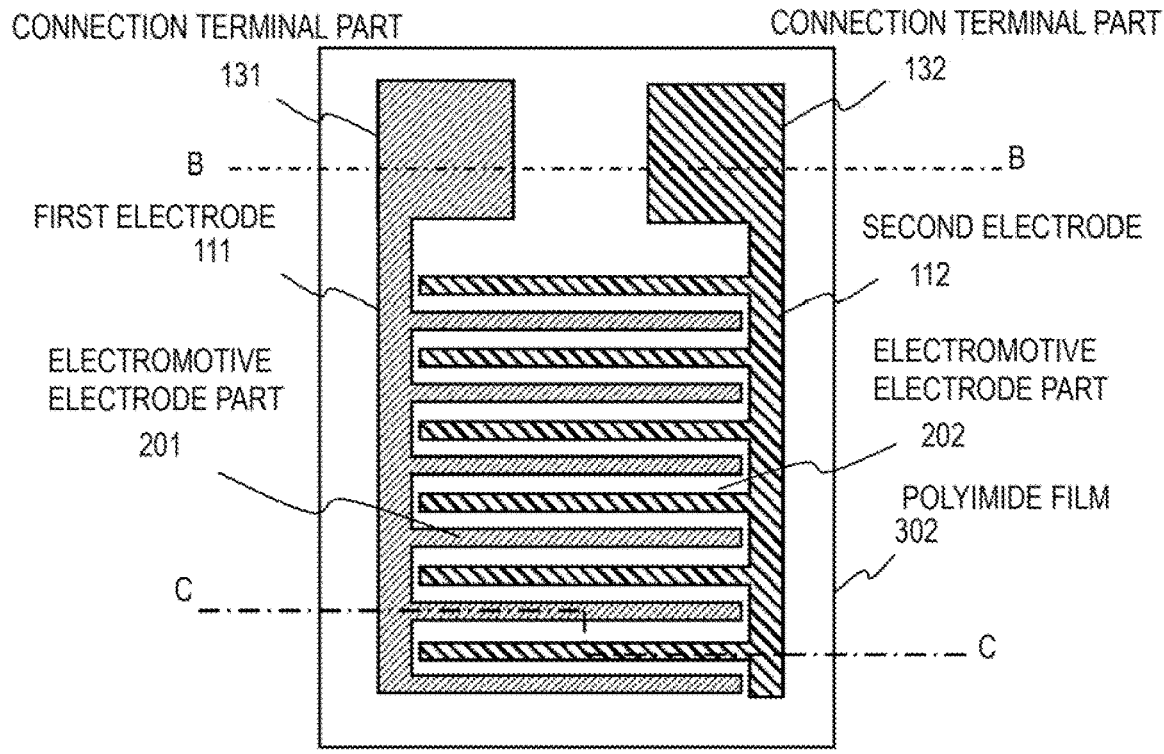
FIG. 19A is a plan diagram of a structure in manufacturing a thermoelectric transducer.
Figure 19B:
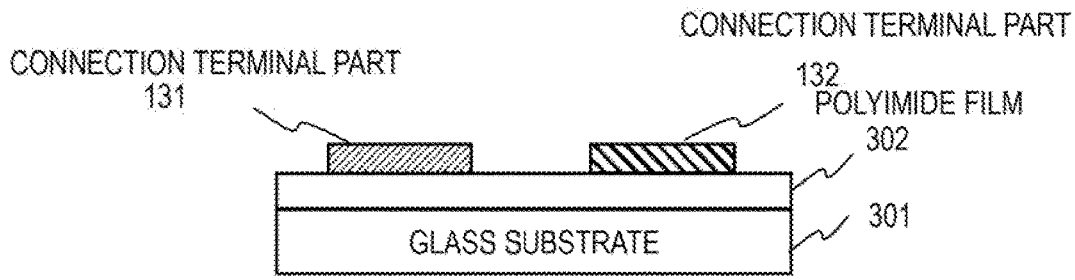
FIG. 19B schematically illustrates the cross-sectional structure along the section line B-B in FIG. 19A.
Figure 19C:
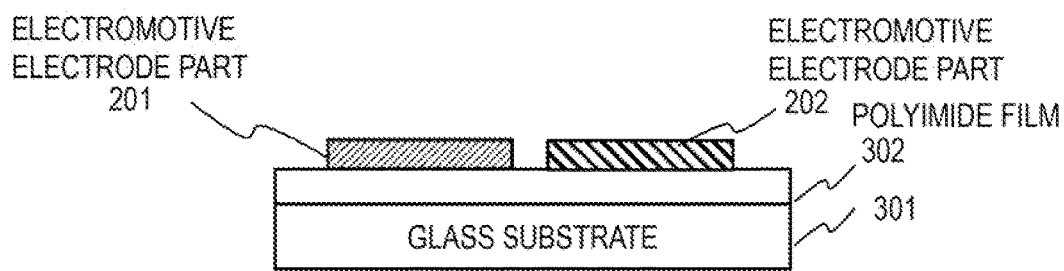
FIG. 19C schematically illustrates the cross-sectional structure along the section line C-C in FIG. 19A.

FIGS. 19A, 19B, and 19C are a plan diagram and two cross-sectional diagrams of the structure after the next step. This step produces a second electrode 112. The cross-sectional diagram of FIG. 19B illustrates the cross-section along the section line B-B in FIG. 19A, which is a cross-section of the area where a connection terminal part 132 is formed. The cross-sectional diagram of FIG. 19C illustrates the cross-section along the section line C-C in FIG. 19A, which is a cross-section of the area where an electromotive part 202 is formed. The second electrode 112 can be produced by the same method as the first electrode 111.

Figure 20A:
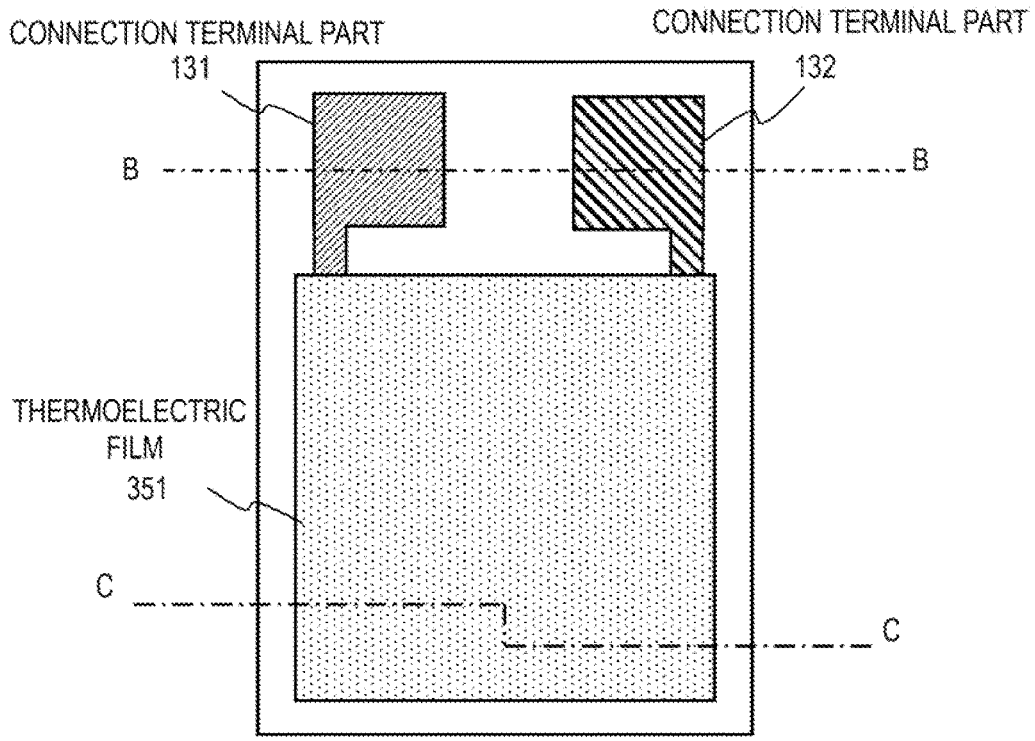
FIG. 20A is a plan diagram of a structure in manufacturing a thermoelectric transducer.
Figure 20B:
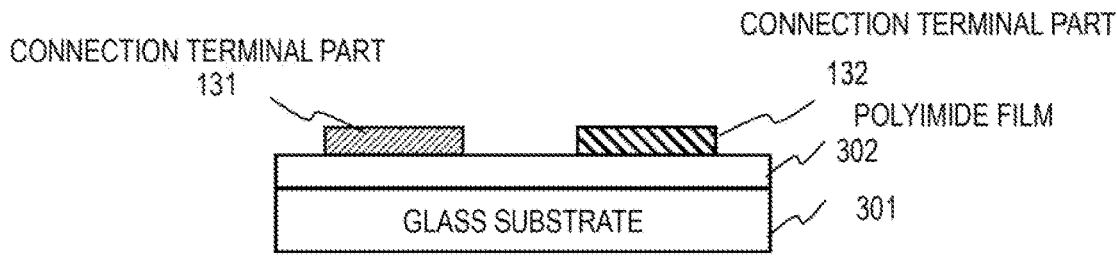
FIG. 20B schematically illustrates the cross-sectional structure along the section line B-B in FIG. 20A.
Figure 20C:
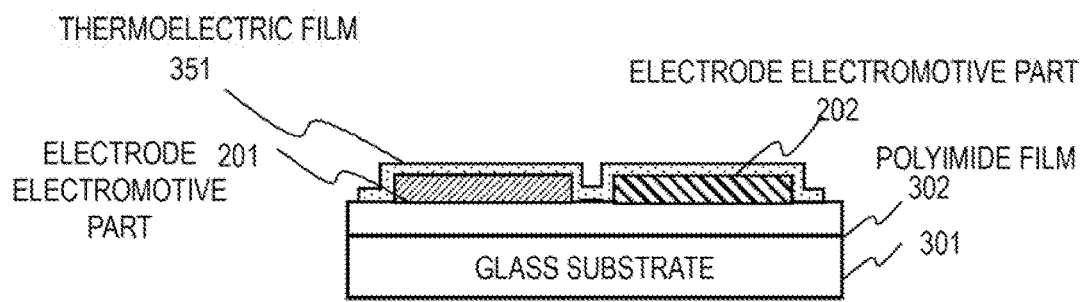
FIG. 20C schematically illustrates the cross-sectional structure along the section line C-C in FIG. 20A.

FIGS. 20A, 20B, and 20C are a plan diagram and cross-sectional diagrams of the structure after the next step. The cross-sectional diagram of FIG. 20B illustrates the cross-section along the section line B-B in FIG. 20A and the cross-sectional diagram of FIG. 20C illustrates the cross-section along the section line C-C in FIG. 20A. This step forms a thermoelectric film 351 to cover the electromotive parts 201 and 202 of the first and the second electrodes but expose the connection terminal parts 131 and 132. For the thermoelectric film 351, an IGZO film can be deposited by sputtering with a metal mask. A different film formation method and/or a different material can be selected.

A structure having a thermoelectric film on the entire side does not allow a proper signal to be taken out because the thermoelectric film is interposed between a lead wire and a connection terminal part. The structure in this embodiment is configured so that the connection terminal parts are located outside the region of the thermoelectric film thereabove and exposed and accordingly, the lead wires and the connection terminal parts are connected so that they can directly contact each other. Moreover, the structure in this embodiment prevents generation of a parasitic device and effects of an attached object to be measured, like the structure of Embodiment 1.

In Embodiment 1, the two electrodes 111 and 112 have to be etched selectively on the thermoelectric film 103 and therefore, patterning with a metal mask is more convenient. In Embodiment 2, etching the two electrodes 111 and 112 is performed before forming the thermoelectric film 351 and therefore, the difficulty in ensuring the selectivity for etching is lowered. Etching achieves finer and more accurate patterning than patterning with a metal mask. Accordingly, manufacturing a high-spec device becomes available.

Embodiment 3

Figure 21:
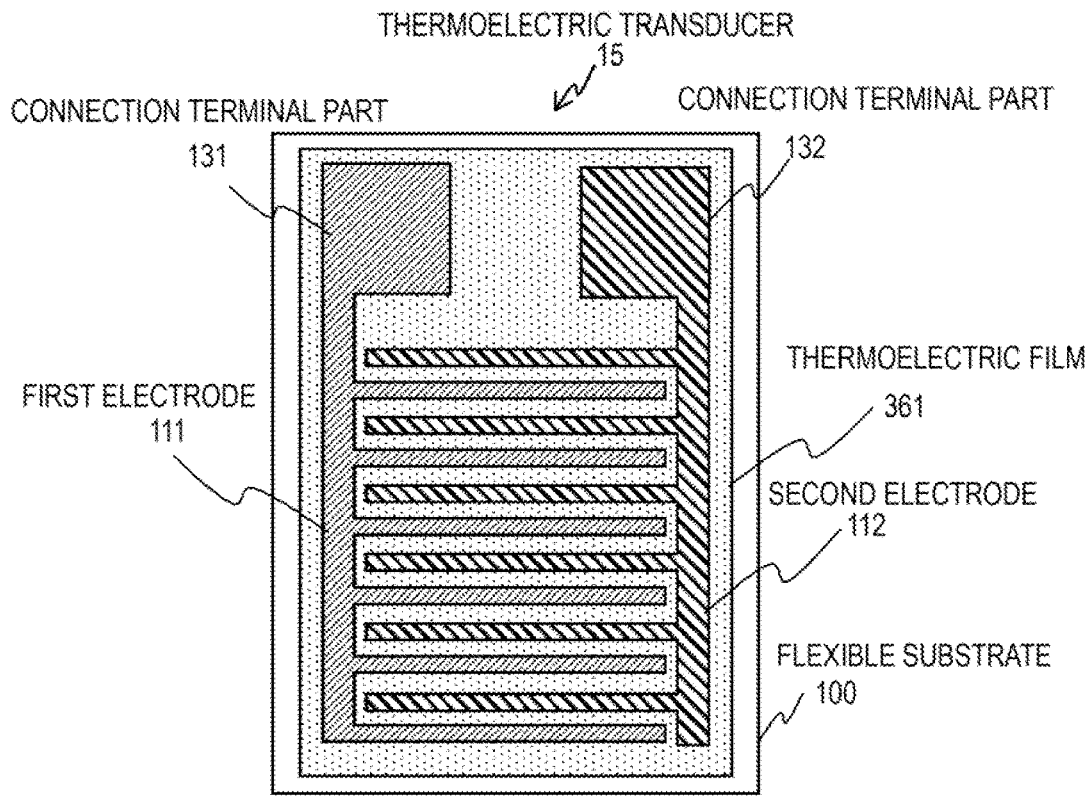
FIG. 21 is a plan diagram of a configuration example of the thermoelectric transducer in Embodiment 3.

FIG. 21 illustrates another configuration example of the thermoelectric transducer 15. In comparison with the configuration of Embodiment 1, the connection terminal parts 131 and 132 are laid on a thermoelectric film 361 that contributes to generation of thermal electromotive force and the connection terminal parts 131 and 132 are located inner than the outer edge of the thermoelectric film 361. The outer edge of the thermoelectric film 361 is located inner than the outer edge of the flexible substrate 100.

The choices for the method to join a lead wire and a connection terminal part increase depending on the condition of use. For example, for the condition that does not require high heat tolerance, joining with conductive adhesive can be a choice. The conductive adhesive does not diffuse too far to penetrate the metal of an electrode or require hard compression. Accordingly, neither the conductive adhesive as joining material nor the lead wire will contact the thermoelectric film and therefore, the thermoelectric film provided under the connection terminal part does not cause a problem. The thermoelectric film 361 that contributes to the device operation (such as sensing or electric generation) is processed so that its outer edge will be located inner than the outer edge of the substrate 100. The manufacturing procedure can be the same as the one in Embodiment 1.

In the configurations described in Embodiments 1 to 3, a rigid (non-flexible) substrate such as a glass substrate can be employed in place of the flexible substrate.

Embodiment 4

Figure 22:
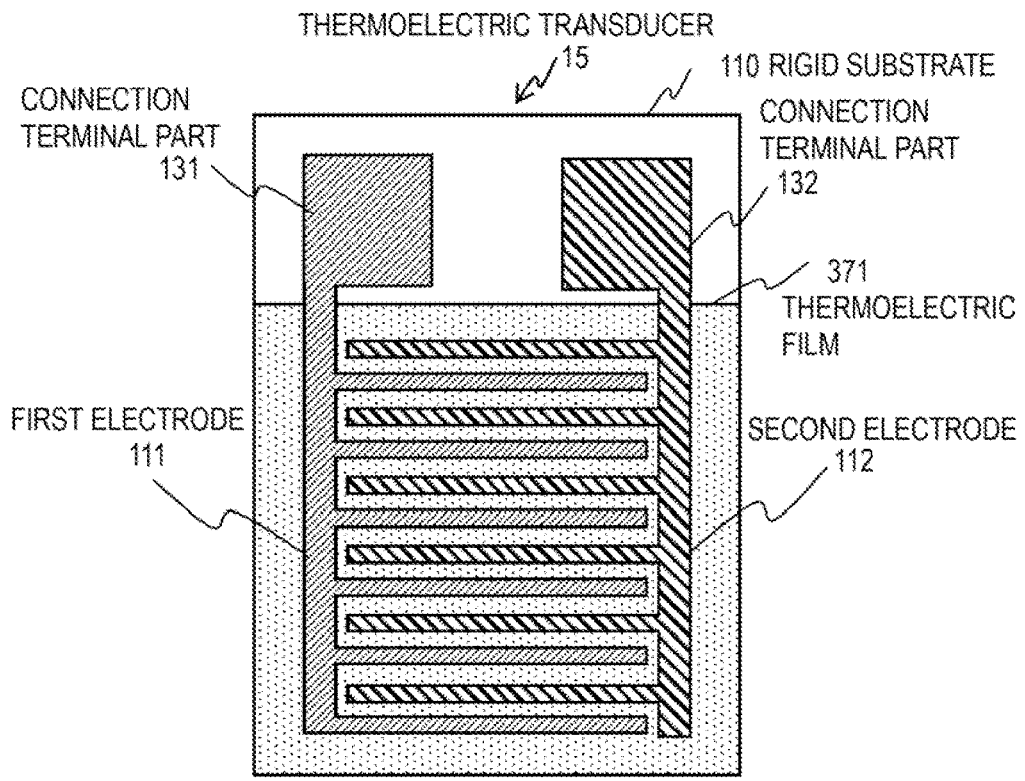
FIG. 22 is a plan diagram of a configuration example of the thermoelectric transducer in Embodiment 4.

FIG. 22 illustrates another configuration example of the thermoelectric transducer 15. In comparison with the configuration of Embodiment 1, the thermoelectric transducer 15 in FIG. 22 includes a rigid substrate 110, instead of a flexible substrate. The substrate 110 can be a glass substrate.

The thermoelectric film 371 extends to ends of the substrate 110. Specifically, a part of the outer edge of the thermoelectric film 371 coincides with a part of the outer edge of the substrate 110. In the example of FIG. 22, three sides of the rectangular thermoelectric film 371 coincide with three sides of the substrate 110. One side is located inner than the outer edge of the substrate 110. The remaining configuration is substantially the same as the configuration in Embodiment 1. For example, the electrodes 111 and 112 are on a layer upper than the thermoelectric film 371 and the connection terminal parts 131 and 132 of the electrodes are disposed in an unseparated area outside the region of the thermoelectric film 371. The connection terminal parts 131 and 132 are distant from the thermoelectric film 371 when viewed planarly. The order of layers of the thermoelectric film and the electrodes can be reversed.

For the condition of use that does not need a flexible substrate but allows or needs a rigid substrate, the substrate used in the manufacturing process such as a glass substrate can be used as a substrate for the thermoelectric transducer, instead of a polyimide substrate. In that case, the steps of forming and detaching a polyimide film can be excluded. The thermoelectric transducer 15 in this embodiment can include a protection film covering the components on the substrate 110. In this case, the connection terminal parts are exposed.

In an example where a glass substrate is employed, the substrate has a thickness of at least 0.5 mm; the thermoelectric film 371 does not droop over the cut surface. Accordingly, even if the thermoelectric film 371 extends to the outer edge of the substrate 110, an object can maintain a distance from the thermoelectric film 371 and does not affect the output of the thermoelectric transducer 15. Since the thermoelectric film does not exist around the connection terminal parts 131 and 132, no parasitic device is generated even if solder penetrates the connection terminal part 131 or 132 or a solder joint is dislocated from the connection terminal part 131 or 132, so that the thermoelectric transducer 15 exhibits stable characteristics. If technically possible, a substrate thinner than this example can be employed.

Hereinafter, an example of the method of manufacturing the thermoelectric transducer in this embodiment is described. An example of the manufacturing procedure does not form a polyimide film but deposits the other components of thermoelectric transducers on a glass substrate and cuts out individual thermoelectric transducers 15. In the following, such an example of the manufacturing procedure is described with reference to plan diagrams and cross-sectional diagrams. The following description is about a manufacturing procedure for one thermoelectric transducer 15 but the actual manufacture fabricates a number of horizontally and vertically arrayed structures together and separates the structures in a later step. The thin-film process and the separation can be performed in a different order from the one described in the following.

Figure 23A:
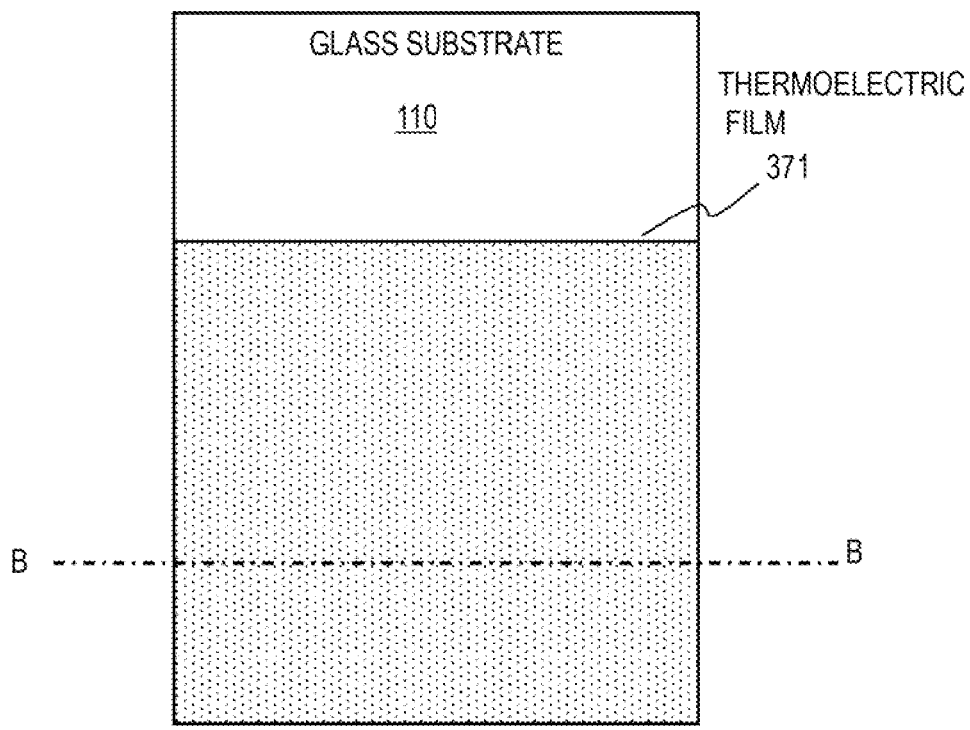
FIG. 23A is a plan diagram of a structure in manufacturing a thermoelectric transducer.
Figure 23B:
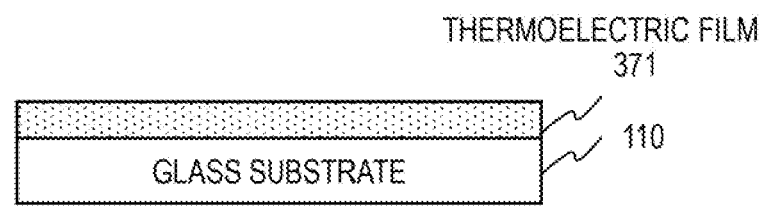
FIG. 23B schematically illustrates the cross-sectional structure along the section line B-B in FIG. 23A.

FIGS. 23A and 23B are a plan diagram and a cross-sectional diagram of the structure after the first step. The cross-sectional diagram of FIG. 23B illustrates the cross-section along the section line B-B in FIG. 23A. This step deposits a thermoelectric film 371 having a desired shape by sputtering with a metal mask. The thermoelectric film 371 is provided in the region other than the rectangular unseparated region where the connection terminal parts 131 and 132 of the electrodes are to be disposed.

Precise positioning of the metal mask is required in only one direction along the vertical axis in FIG. 23A. Compared to the metal masks for the electrodes 111 and 112, high precision is not necessary; the thermoelectric film 371 can be prepared by rough metal-masking. The thermoelectric film 371 can be formed by a different method that does not use a metal mask.

Figure 24A:
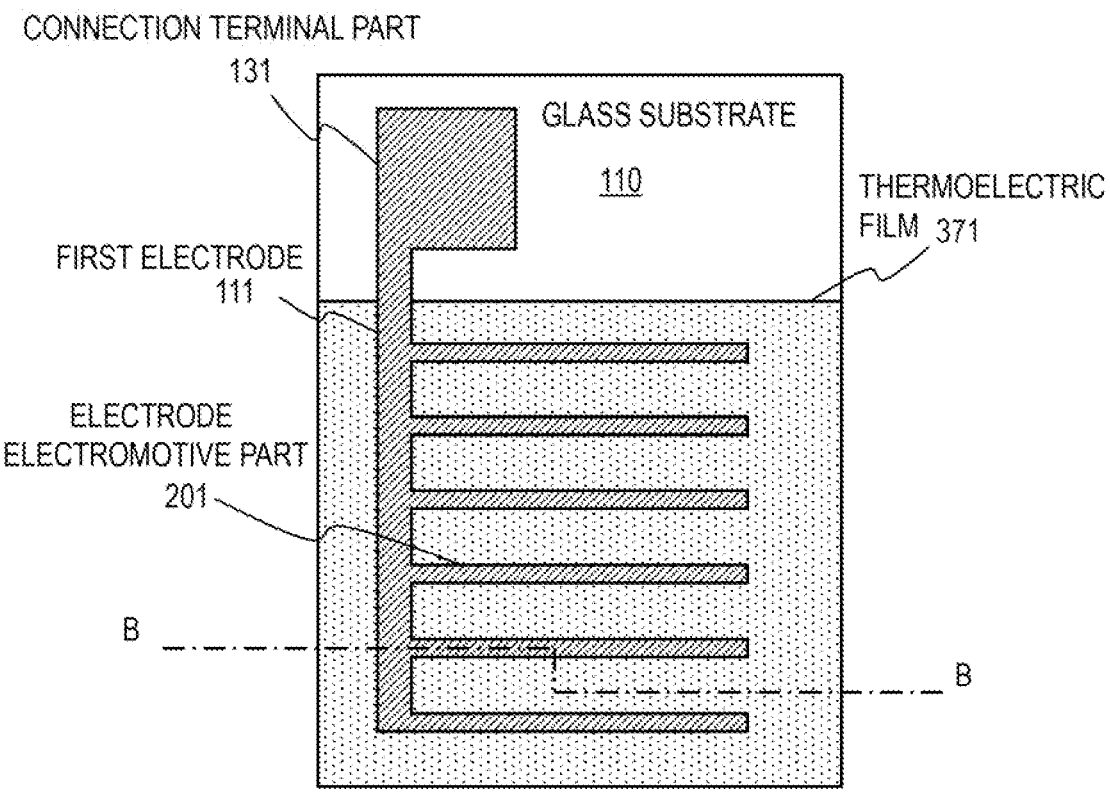
FIG. 24A is a plan diagram of a structure in manufacturing a thermoelectric transducer.
Figure 24B:
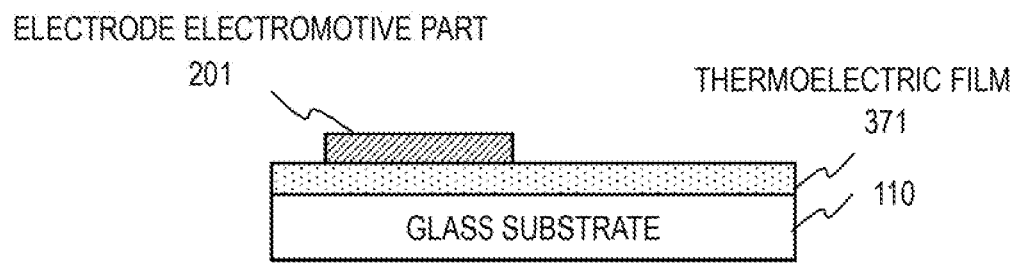
FIG. 24B schematically illustrates the cross-sectional structure along the section line B-B in FIG. 24A.

FIGS. 24A and 24B are a plan diagram and a cross-sectional diagram of the structure after the next step. This step produces a first electrode 111. The cross-sectional diagram of FIG. 24B illustrates the cross-section along the section line B-B in FIG. 24A, which is a cross-section of the area where an electromotive part 201 is formed. The first electrode 111 can be produced by the same method as the one in Embodiment 1.

Figure 25A:
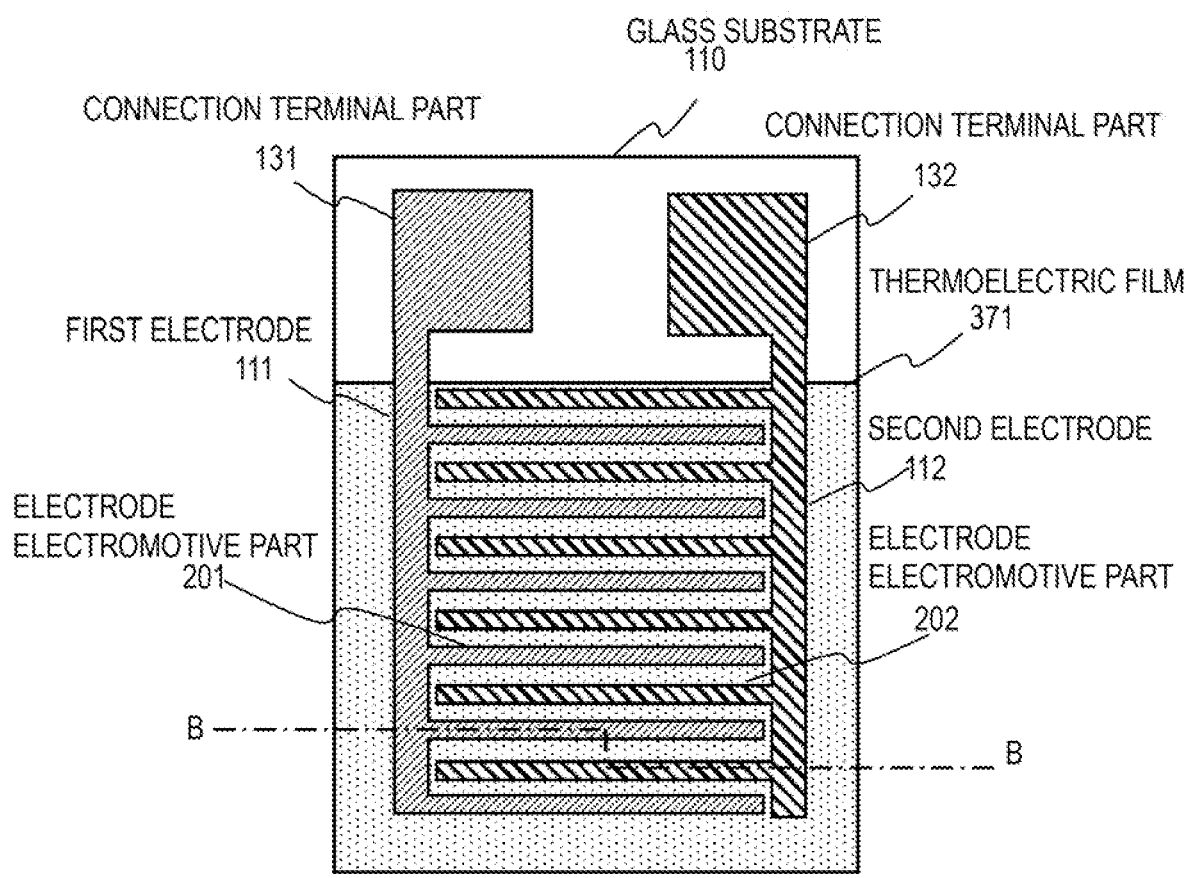
FIG. 25A is a plan diagram of a structure in manufacturing a thermoelectric transducer.
Figure 25B:
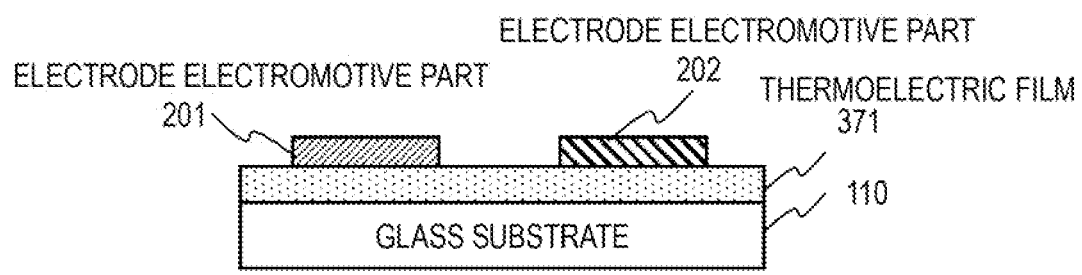
FIG. 25B schematically illustrates the cross-sectional structure along the section line B-B in FIG. 25A.

FIGS. 25A and 25B are a plan diagram and a cross-sectional diagram of the structure after the next step. This step produces a second electrode 112. The cross-sectional diagram of FIG. 25B illustrates the cross-section along the section line B-B in FIG. 25A, which is a cross-section of the area where an electromotive part 202 is formed. The second electrode 112 can be produced by the same method as the first electrode 111.

Embodiment 5

Figure 26A:
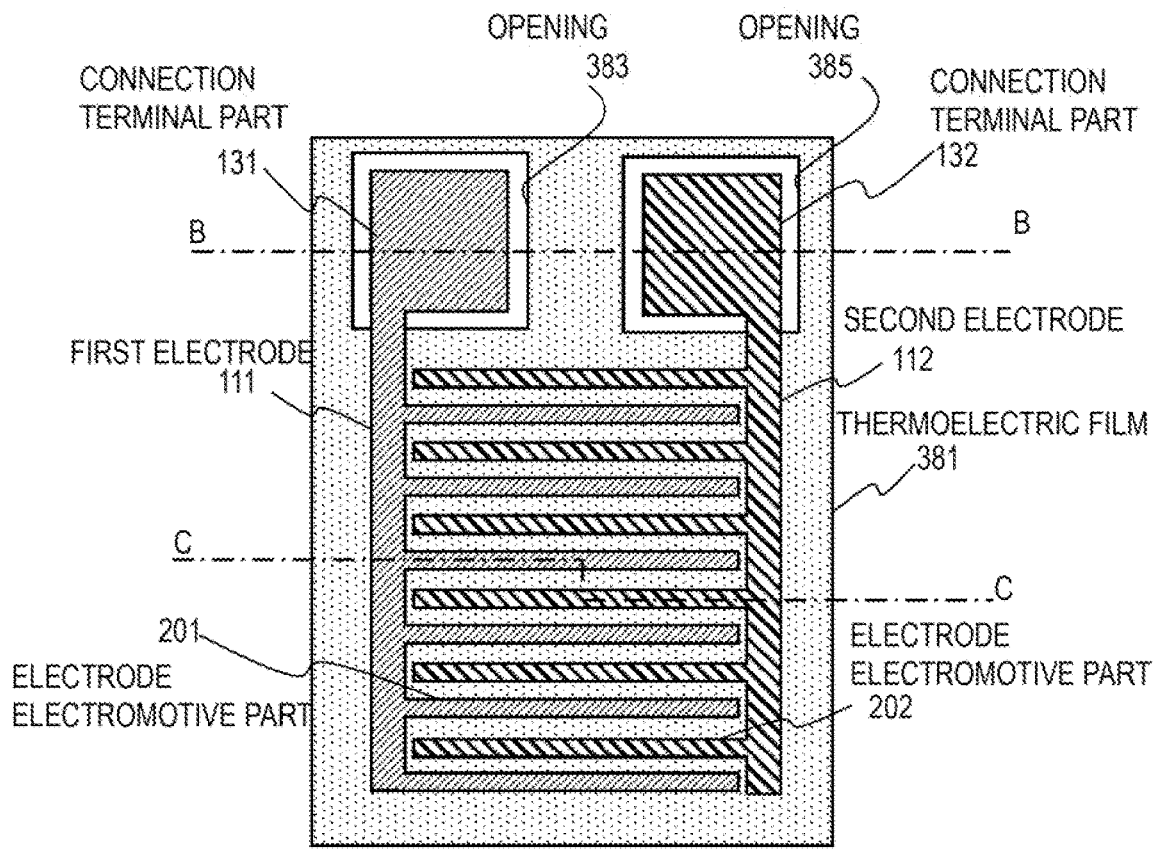
FIG. 26A is a plan diagram of a configuration example of a thermoelectric transducer in Embodiment 5.
Figure 26B:
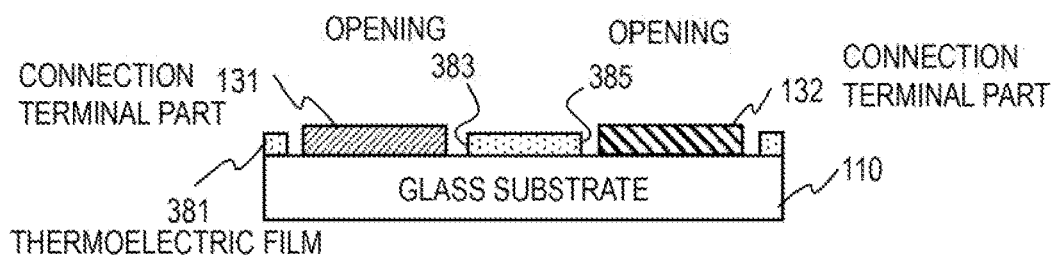
FIG. 26B is a cross-sectional diagram of the thermoelectric transducer in FIG. 25A along the section line B-B.
Figure 26C:
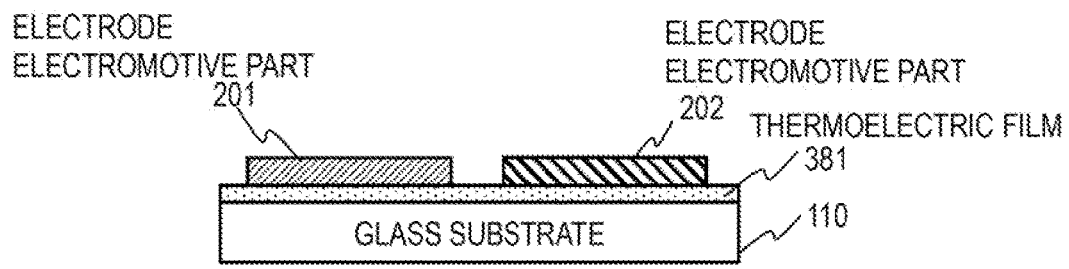
FIG. 26C is a cross-sectional diagram of the thermoelectric transducer in FIG. 25A along the section line C-C.

FIGS. 26A, 26B, and 26C illustrate another configuration example of the thermoelectric transducer 15. FIG. 26A is a plan diagram of a thermoelectric transducer 15. FIG. 26B is a cross-sectional diagram of the thermoelectric transducer 15 along the section line B-B in FIG. 26A and FIG. 26C is a cross-sectional diagram of the thermoelectric transducer 15 along the section line C-C in FIG. 26A.

In comparison with the configuration in Embodiment 1, the thermoelectric transducer 15 in this embodiment includes a rigid substrate 110, instead of a flexible substrate. The substrate 110 can be a glass substrate. The thermoelectric film 381 extends to the ends of the substrate 110. Specifically, the outer edge of the thermoelectric film 381 coincides with the outer edge of the substrate 110. In the example of FIG. 26A, the four sides of the rectangular thermoelectric film 381 coincide with the four sides of the substrate 110. The thermoelectric transducer 15 in this embodiment can include a protection film covering the components on the substrate 110. In this case, the connection terminal parts are exposed.

Like the substrate in Embodiment 4, the glass substrate has a thickness of at least 0.5 mm; the thermoelectric film 381 does not droop over the cut surface. Accordingly, even if the thermoelectric film 381 extends to the outer edge of the substrate 110, an object can maintain a distance from the thermoelectric film 381 and does not affect the output of the thermoelectric transducer 15. If technically possible, a substrate thinner than this example can be employed.

The thermoelectric film 381 has two openings 383 and 385. The connection terminal parts 131 and 132 of the electrodes are disposed to be distant from the thermoelectric film 381 when viewed planarly, so as not to contact with the thermoelectric film 381. That is to say, the connection terminal parts 131 and 132 are disposed outside the region of the thermoelectric film 381. More specifically, the connection terminal part 131 is disposed within the opening 383 and the connection terminal part 131 is disposed within the opening 385. The electrodes 111 and 112 are on a layer upper than the thermoelectric film 385; neither the connection terminal part 131 nor 132 are in contact with the thermoelectric film 381. The order of layers of the thermoelectric film and the electrodes can be reversed.

Hereinafter, an example of the method of manufacturing the thermoelectric transducer in this embodiment is described. In the following, an example of a manufacturing procedure including a lift-off process is described with reference to plan diagrams and cross-sectional diagrams. The following description is about a manufacturing procedure for one thermoelectric transducer 15 but the actual manufacture fabricates a number of horizontally and vertically arrayed structures together and separates the structures in a later step. The thin-film process and the separation can be performed in a different order from the one described in the following.

Figure 27A:
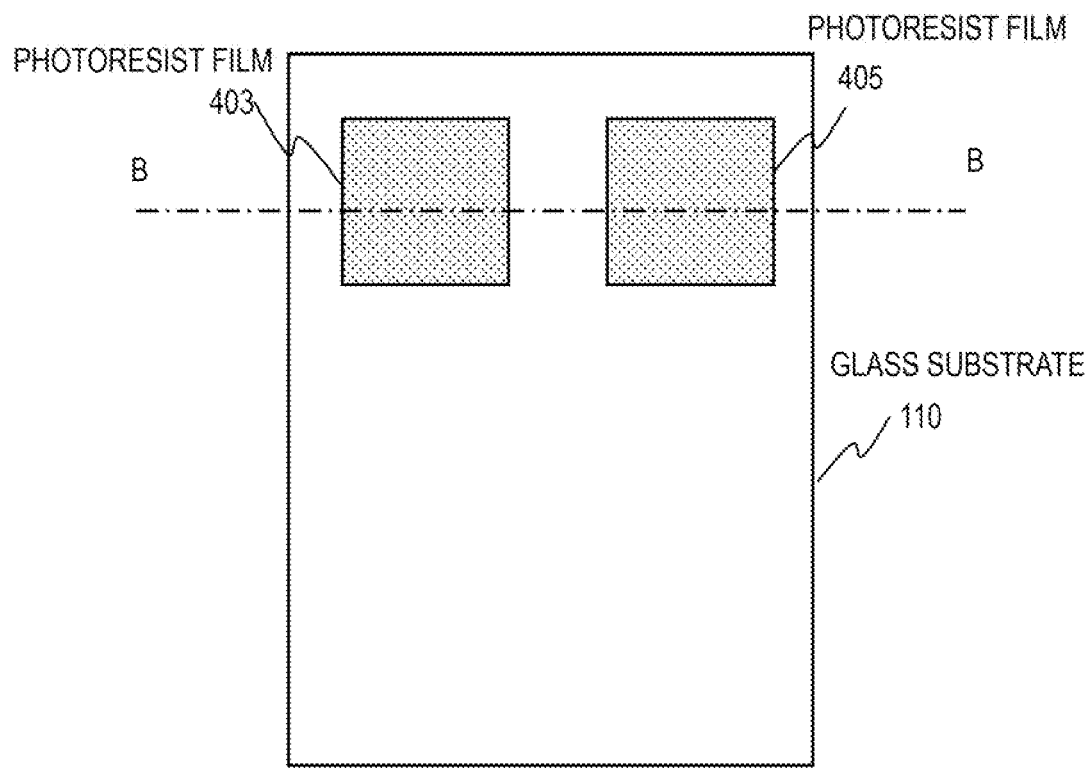
FIG. 27A is a plan diagram of a structure in manufacturing a thermoelectric transducer.
Figure 27B:
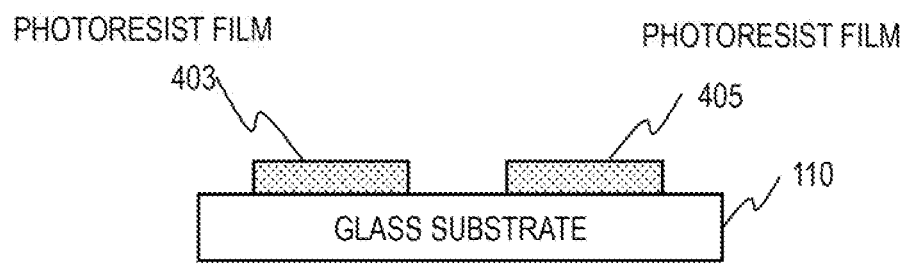
FIG. 27B schematically illustrates the cross-sectional structure along the section line B-B in FIG. 27A.

FIGS. 27A and 27B are a plan diagram and a cross-sectional diagram of the structure after the first step. The cross-sectional diagram of FIG. 27B illustrates the cross-section along the section line B-B in FIG. 27A. This step forms photoresist films 403 and 405 on a glass substrate 110 by photolithography. As will be described later, the regions of the photoresist films 403 and 405 correspond to the openings 383 and 385.

Figure 28A:
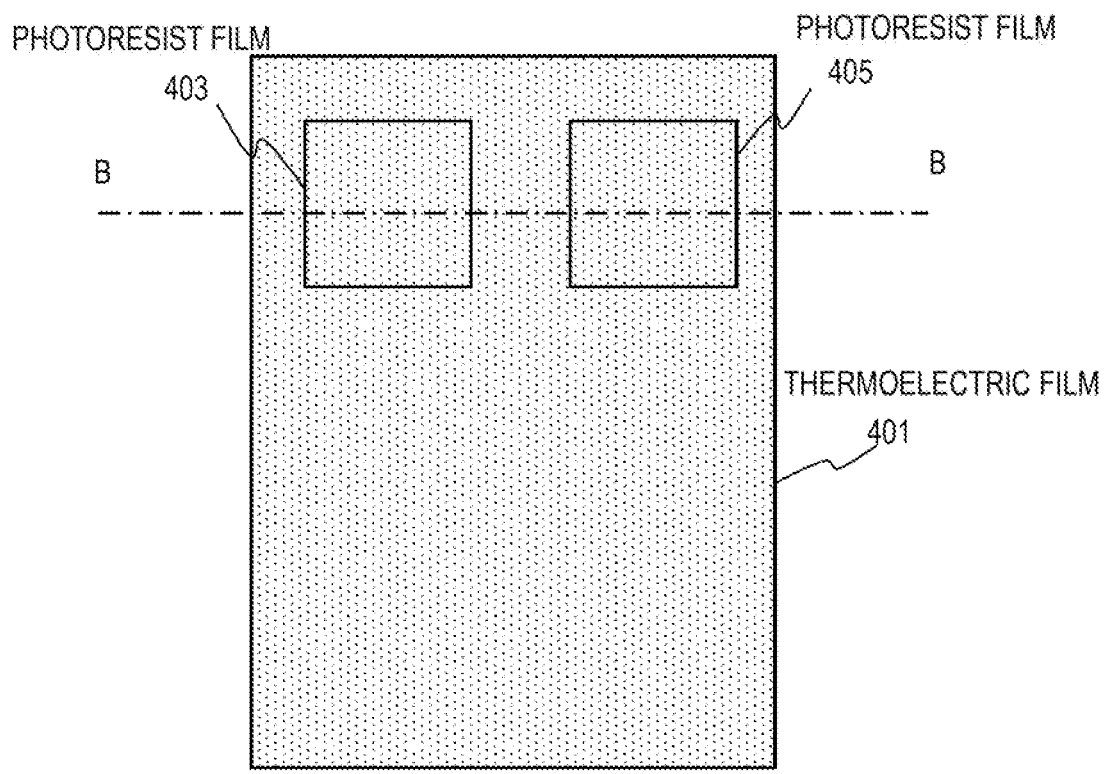
FIG. 28A is a plan diagram of a structure in manufacturing a thermoelectric transducer.
Figure 28B:
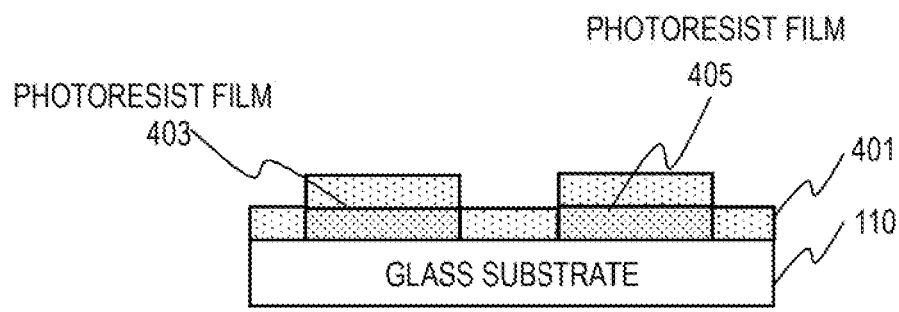
FIG. 28B schematically illustrates the cross-sectional structure along the section line B-B in FIG. 28A.

FIGS. 28A and 28B are a plan diagram and a cross-sectional diagram of the structure after the next step. The cross-sectional diagram of FIG. 28B illustrates the cross-section along the section line B-B in FIG. 28A. This step deposits a thermoelectric film 401 on an entire side of the glass substrate 110 with photoresist films 403 and 405 by sputtering, for example. The thermoelectric film 401 is laid above and in contact with the exposed surface of the glass substrate 110 and the photoresist films 403 and 405.

Figure 29A:
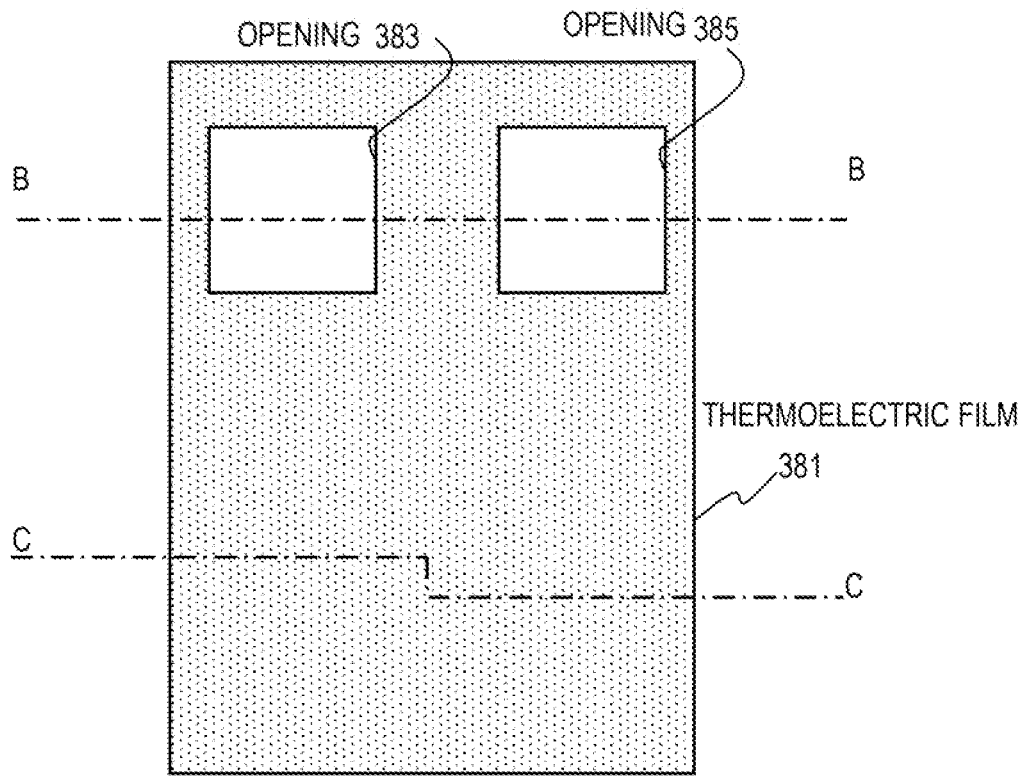
FIG. 29A is a plan diagram of a structure in manufacturing a thermoelectric transducer.
Figure 29B:
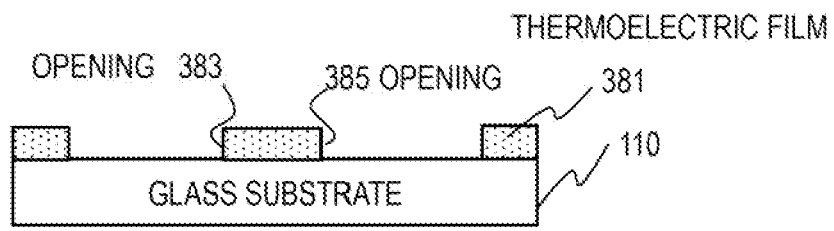
FIG. 29B schematically illustrates the cross-sectional structure along the section line B-B in FIG. 29A.
Figure 29C:
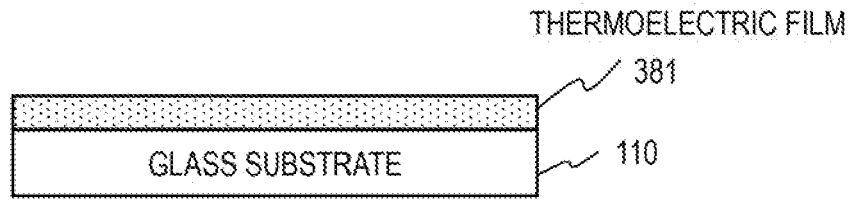
FIG. 29C schematically illustrates the cross-sectional structure along the section line C-C in FIG. 29A.

FIGS. 29A, 29B, and 29C are a plan diagram and cross-sectional diagrams of the structure after the next step. The cross-sectional diagram of FIG. 29B illustrates the cross-section along the section line B-B in FIG. 29A and the cross-sectional diagram of FIG. 29C illustrates the cross-section along the section line C-C in FIG. 29A. This step removes the photoresist films 403 and 405 to remove the thermoelectric film in the corresponding regions, so that a thermoelectric film 381 having openings 383 and 385 is obtained. The lift-off progresses from the periphery of the pattern and therefore, a smaller area can be processed in a shorter time than a larger area. Compared to Embodiment 4, the process is completed in a short time because this embodiment removes only the parts corresponding to the connection terminals.

Figure 30A:
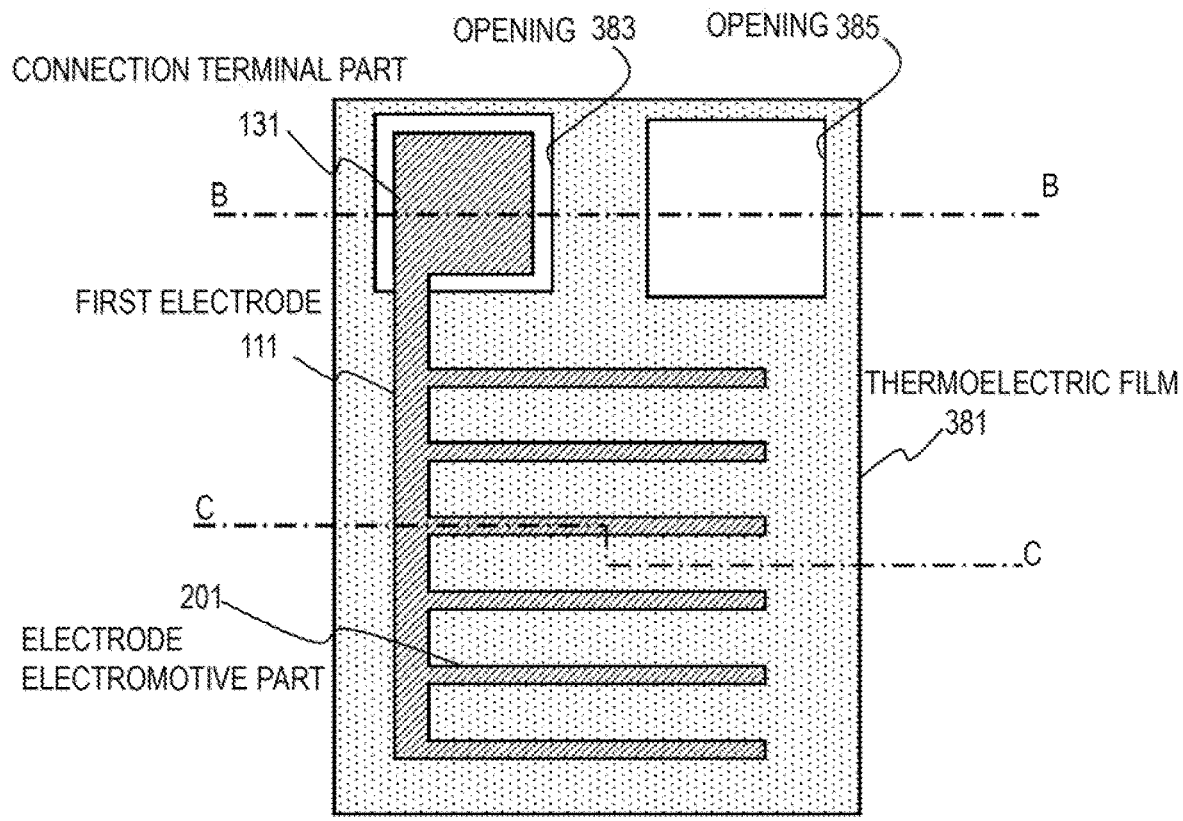
FIG. 30A is a plan diagram of a structure in manufacturing a thermoelectric transducer.
Figure 30B:
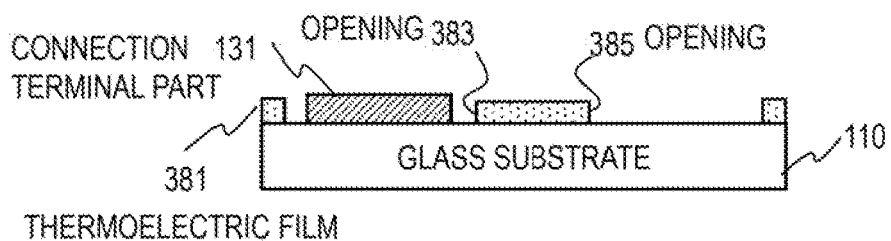
FIG. 30B schematically illustrates the cross-sectional structure along the section line B-B in FIG. 30A.
Figure 30C:
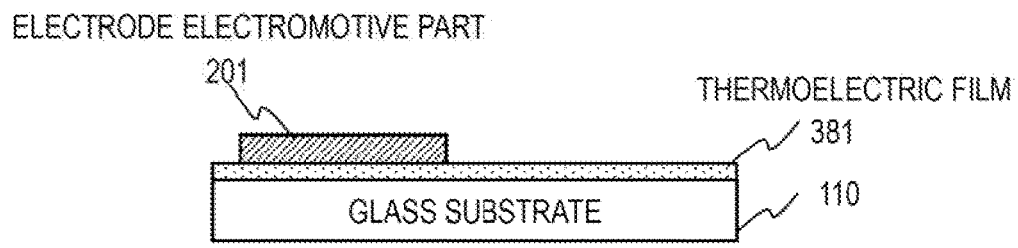
FIG. 30C schematically illustrates the cross-sectional structure along the section line C-C in FIG. 30A.

FIGS. 30A, 30B, and 30C are a plan diagram and two cross-sectional diagrams of the structure after the next step. This step produces a first electrode 111. The cross-sectional diagram of FIG. 30B illustrates the cross-section along the section line B-B in FIG. 30A, which is a cross-section of the area where a connection terminal part 131 is formed. The cross-sectional diagram of FIG. 30C illustrates the cross-section along the section line C-C in FIG. 30A, which is a cross-section of the area where an electromotive part 201 is formed. The connection terminal part 131 is located inside the opening 383. The first electrode 111 can be produced by the same method as the one in Embodiment 1.

Figure 31A:
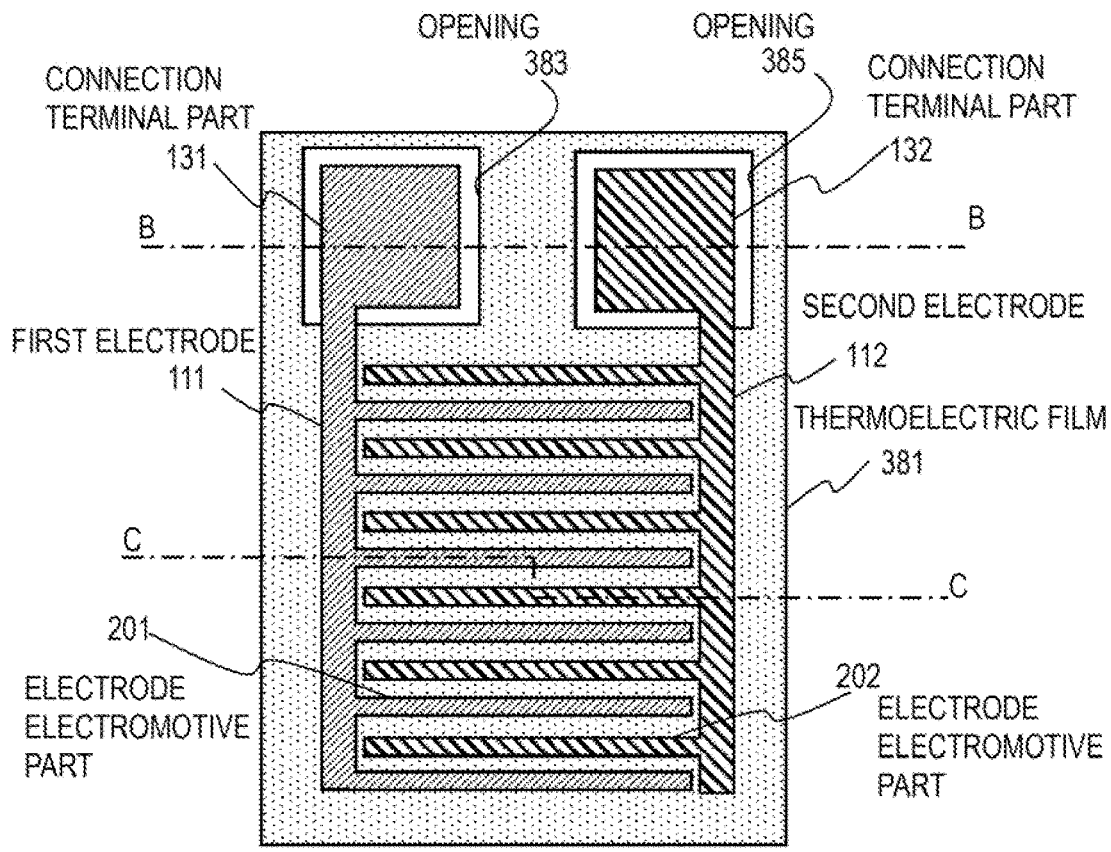
FIG. 31A is a plan diagram of a structure in manufacturing a thermoelectric transducer.
Figure 31B:
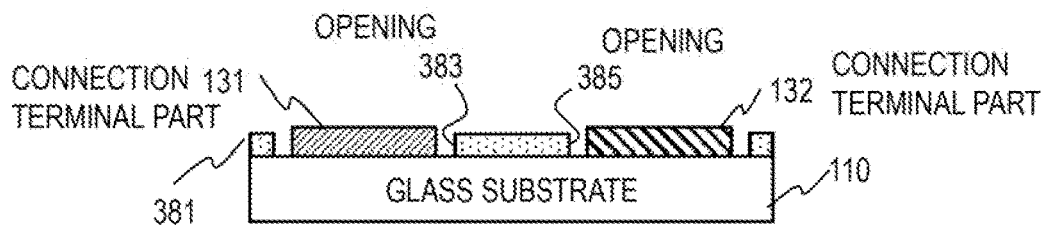
FIG. 31B schematically illustrates the cross-sectional structure along the section line B-B in FIG. 31A.
Figure 31C:
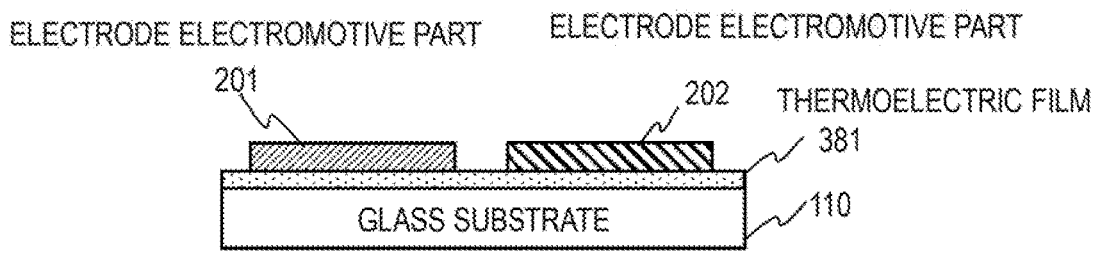
FIG. 31C schematically illustrates the cross-sectional structure along the section line C-C in FIG. 31A.

FIGS. 31A, 31B, and 31C are a plan diagram and two cross-sectional diagrams of the structure after the next step. This step produces a second electrode 112. The cross-sectional diagram of FIG. 31B illustrates the cross-section along the section line B-B in FIG. 31A, which is a cross-section of the area where a connection terminal part 132 is formed. The cross-sectional diagram of FIG. 31C illustrates the cross-section along the section line C-C in FIG. 31A, which is a cross-section of the area where an electromotive part 202 is formed. The connection terminal part 132 is inside the opening 385. The second electrode 112 can be produced by the same method as the first electrode 111.

Figure 32:
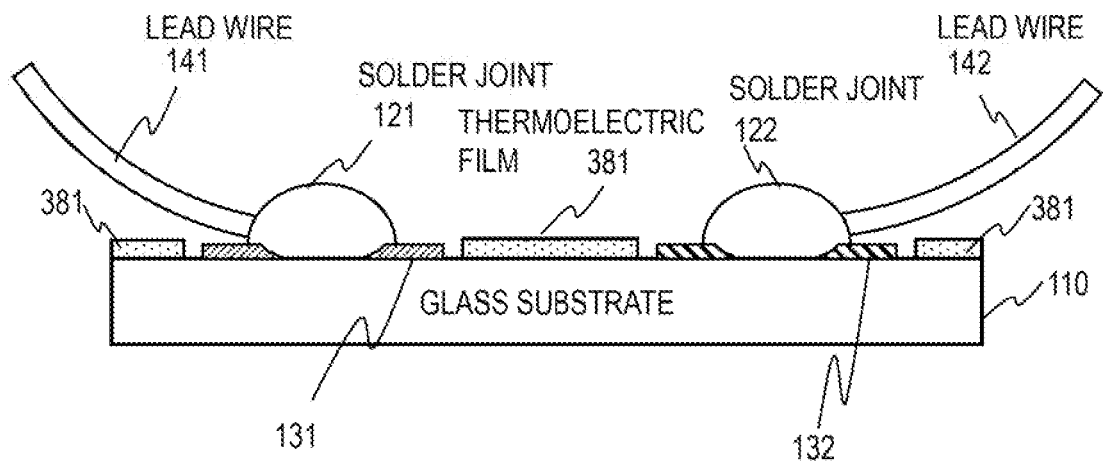
FIG. 32 illustrates a configuration example of a joint.

FIG. 32 illustrates a configuration example of a joint in the configuration example illustrated in FIGS. 31A to 31C. The connection terminal parts 131 and 132 are not laid on the thermoelectric film 381 and therefore, even if the solder joint 121 or 122 penetrates the connection terminal parts 131 or 132, a parasitic device is not generated and the thermoelectric transducer 15 exhibits stable characteristics.

Figure 33:
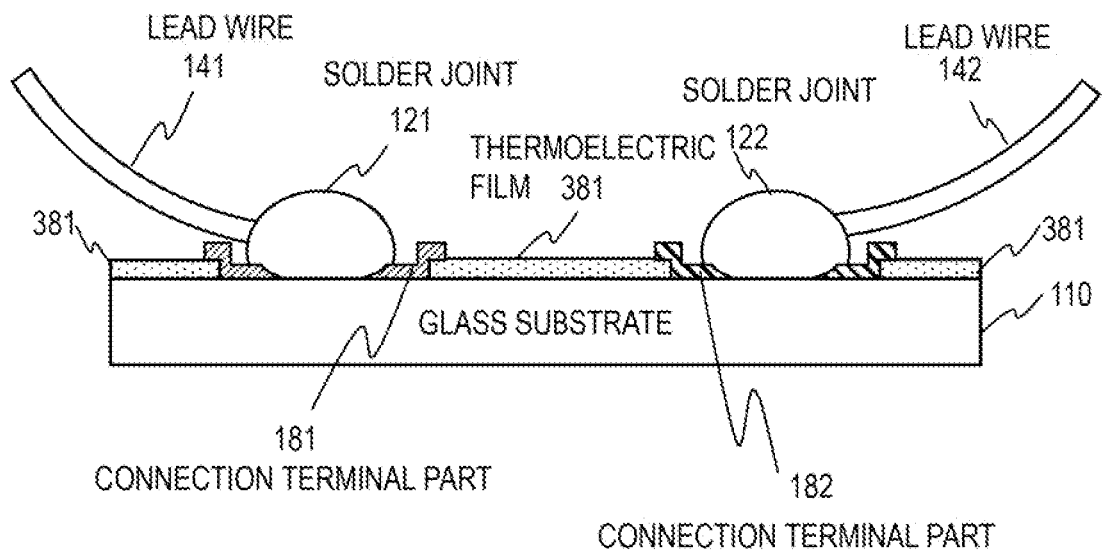
FIG. 33 illustrates another configuration example of a joint.

FIG. 33 illustrates another configuration example of a joint in this embodiment. The connection terminal parts 181 and 182 in the configuration example in FIG. 33 are partially laid above and in contact with the thermoelectric film 381. Specifically, the peripheral parts of the connection terminal parts 181 and 182 are in contact with the thermoelectric film 381. However, the solder joint 121 interconnecting the lead wire 141 and the connection terminal part 181 and the solder joint 122 interconnecting the lead wire 142 and the connection terminal part 182 are located within the openings 383 and 385, respectively; they are distant from the thermoelectric film 381 within the plane of the substrate. This configuration can also prevent generation of a parasitic device between the thermoelectric film 381 and a lead wire or a solder joint.

Embodiment 6

Figure 34A:
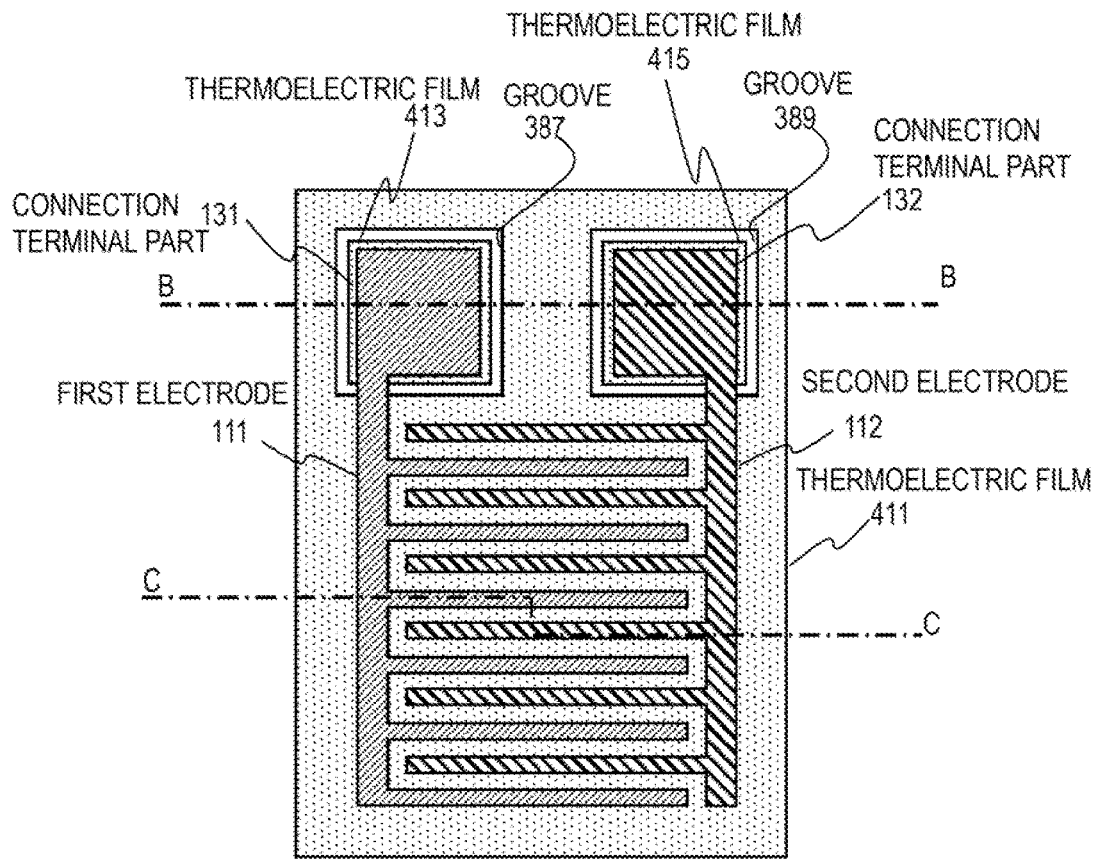
FIG. 34A is a plan diagram of a configuration example of the thermoelectric transducer in Embodiment 6.
Figure 34B:
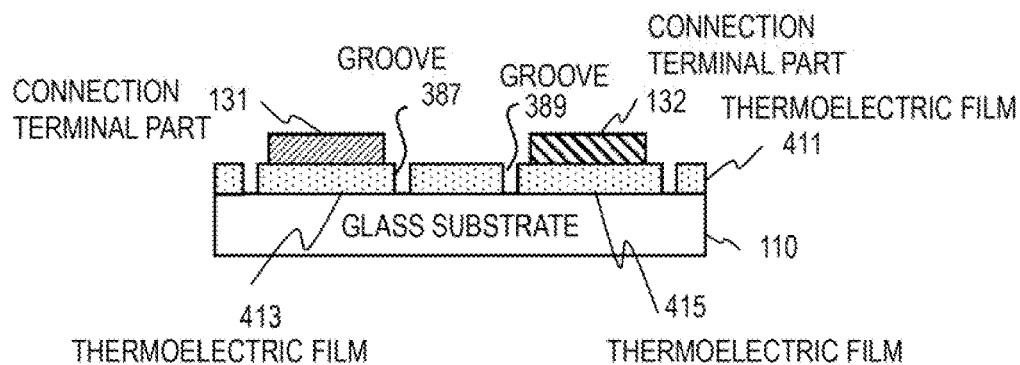
FIG. 34B is a cross-sectional diagram of the thermoelectric transducer in FIG. 34A along the section line B-B.
Figure 34C:
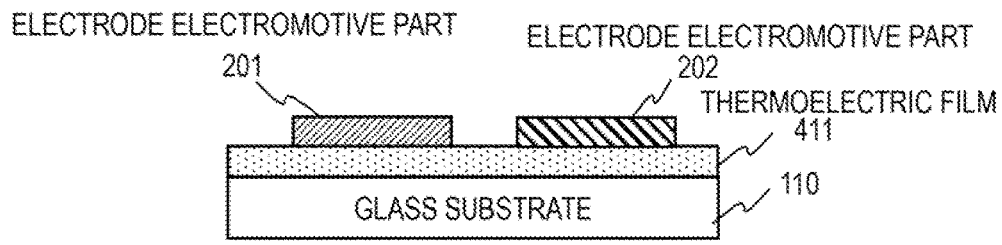
FIG. 34C is a cross-sectional diagram of the thermoelectric transducer in FIG. 34A along the section line C-C.

FIGS. 34A, 34B, and 34C illustrate another configuration example of the thermoelectric transducer 15. FIG. 34A is a plan diagram of a thermoelectric transducer 15. FIG. 34B is a cross-sectional diagram of the thermoelectric transducer 15 along the section line B-B in FIG. 34A and FIG. 34C is a cross-sectional diagram of the thermoelectric transducer 15 along the section line C-C in FIG. 34A. In comparison with the configuration in Embodiment 5, this configuration example includes island-like thermoelectric films 413 and 415, in addition to the thermoelectric film 411. The thermoelectric transducer 15 in this embodiment can include a protection film covering the components on the substrate 110. In this case, the connection terminal parts are exposed.

The thermoelectric film 411 has the same shape as the thermoelectric film 381 in Embodiment 5. Specifically, the thermoelectric film 411 extends to the ends of the substrate 110. The outer edge of the thermoelectric film 411 coincides with the outer edge of the substrate 110. In the example of FIG. 34A, the four sides of the rectangular thermoelectric film 411 coincide with the four sides of the substrate 110.

The thermoelectric films 411, 413, and 415 are separate from one another. As will be described later, these films are included in the same layer of thermoelectric material produced simultaneously by the same process. As to the shape, the thermoelectric film 411 has two openings like the thermoelectric film 381 in Embodiment 5; the thermoelectric films 413 and 415 are disposed within these openings. A groove 387 is provided between the thermoelectric film 411 and the thermoelectric film 413 and a groove 389 is provided between the thermoelectric film 411 and the thermoelectric film 415. Unlike the thermoelectric film 411, neither the thermoelectric film 413 nor 415 contributes to generation of thermal electromotive force (device operation).

The connection terminal parts 131 and 132 are laid above and in contact with the thermoelectric films 413 and 415, respectively. The peripheries of the connection terminal parts 131 and 132 are located inner than the peripheries of the thermoelectric films 413 and 415 and they are distant from the thermoelectric film 411. The configuration such that the connection terminal parts 131 and 132 are disposed outside the thermoelectric film 411 and within the openings of the thermoelectric film 411 when viewed planarly is the same as the configuration of Embodiment 5.

Even if some metal other than the electrodes 111 and 112 contacts the thermoelectric film 413 or 415 isolated from the thermoelectric film 411 that contributes to the device operation, the contact does not affect the voltage between the electrodes. Accordingly, even if the joint between a connection terminal part 131 or 132 and a lead wire penetrates the connection terminal part, a parasitic device is not generated and the thermoelectric transducer 15 exhibits stable characteristics.

Hereinafter, an example of the method of manufacturing the thermoelectric transducer 15 in this embodiment is described. In the following, an example of a manufacturing procedure using a laser to process a thermoelectric film is described with reference to plan diagrams and cross-sectional diagrams. The following description is about a manufacturing procedure for one thermoelectric transducer 15 but the actual manufacture fabricates a number of horizontally and vertically arrayed structures together and separates the structures in a later step. The thin-film process and the separation can be performed in a different order from the one described in the following.

Figure 35A:
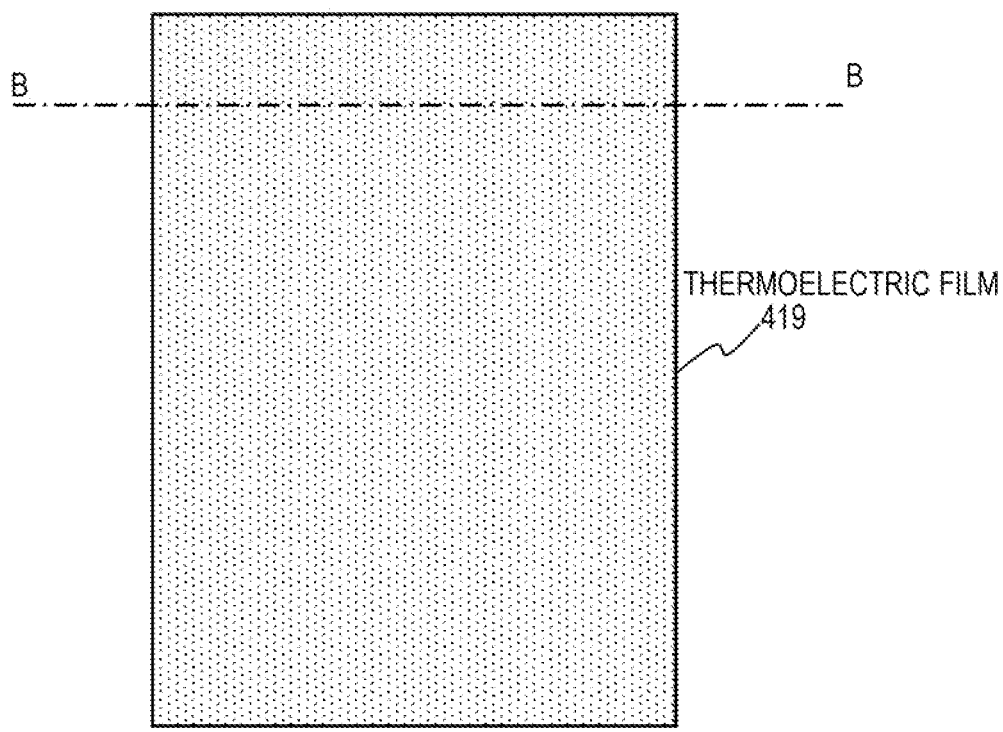
FIG. 35A is a plan diagram of a structure in manufacturing a thermoelectric transducer.
Figure 35B:
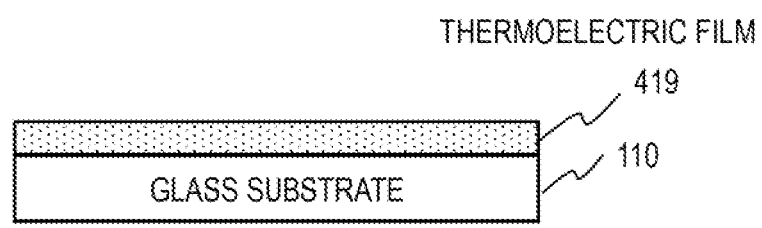
FIG. 35B schematically illustrates the cross-sectional structure along the section line B-B in FIG. 35A.

FIGS. 35A and 35B are a plan diagram and a cross-sectional diagram of the structure after the first step. This step deposits a thermoelectric film 419 on an entire side of the glass substrate 110 by sputtering, for example.

Figure 36A:
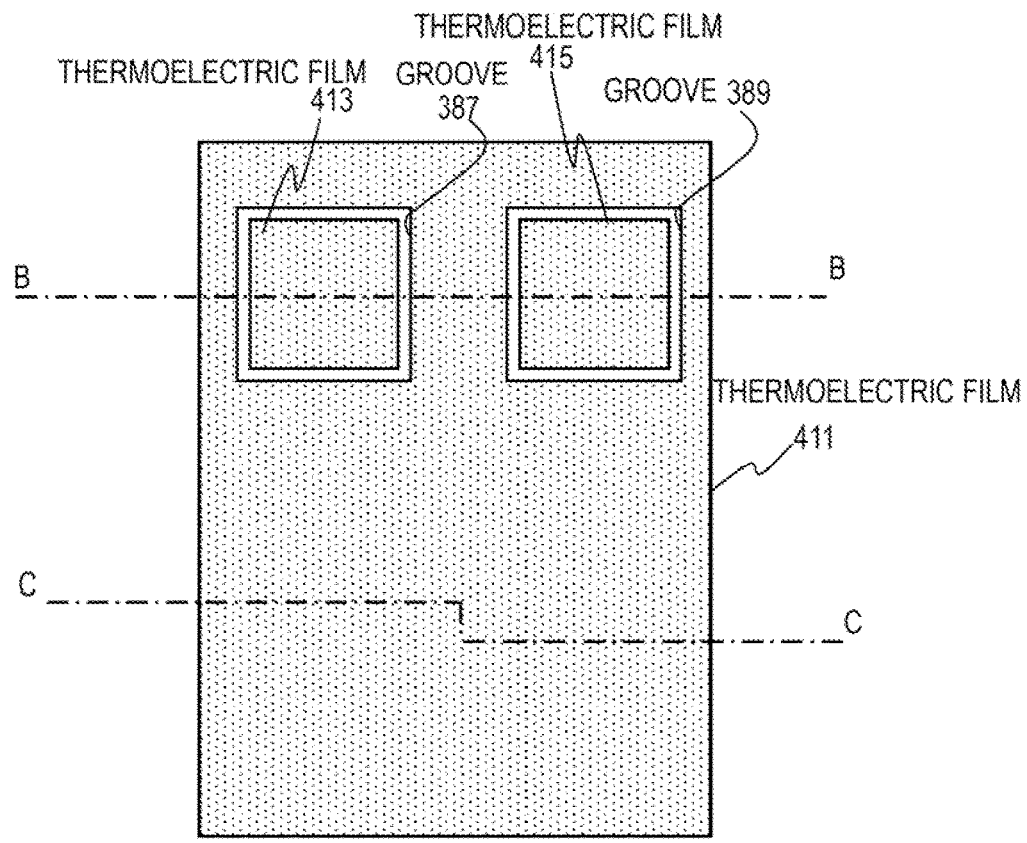
FIG. 36A is a plan diagram of a structure in manufacturing a thermoelectric transducer.
Figure 36B:
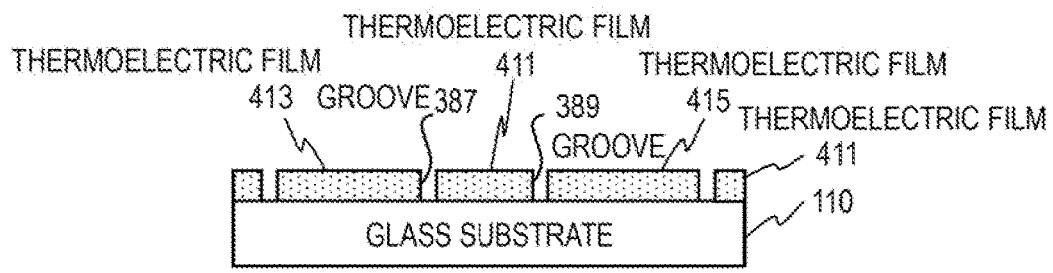
FIG. 36B schematically illustrates the cross-sectional structure along the section line B-B in FIG. 36A.
Figure 36C:
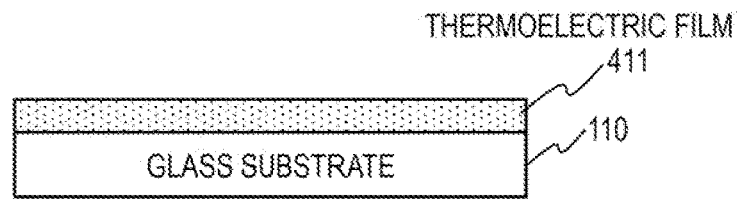
FIG. 36C schematically illustrates the cross-sectional structure along the section line C-C in FIG. 36A.

FIGS. 36A, 36B, and 36C are a plan diagram and cross-sectional diagrams of the structure after the next step. The cross-sectional diagram of FIG. 36B illustrates the cross-section along the section line B-B in FIG. 36A and the cross-sectional diagram of FIG. 36C illustrates the cross-section along the section line C-C in FIG. 36A. This step removes the thermoelectric film 419 in the parts surrounding the areas where connection terminal parts are to be disposed by laser beam processing. This process forms a groove 387 between the thermoelectric films 411 and 413 and a groove 389 between the thermoelectric films 411 and 415.

The grooves between thermoelectric films can be formed by removing a thermoelectric film in a line, not in a plane as described in Embodiment 4 and 5. Accordingly, laser beam processing is suitable because it does not need masking but scans the thermoelectric film 419 with a spot beam along the cut lines.

Figure 37A:
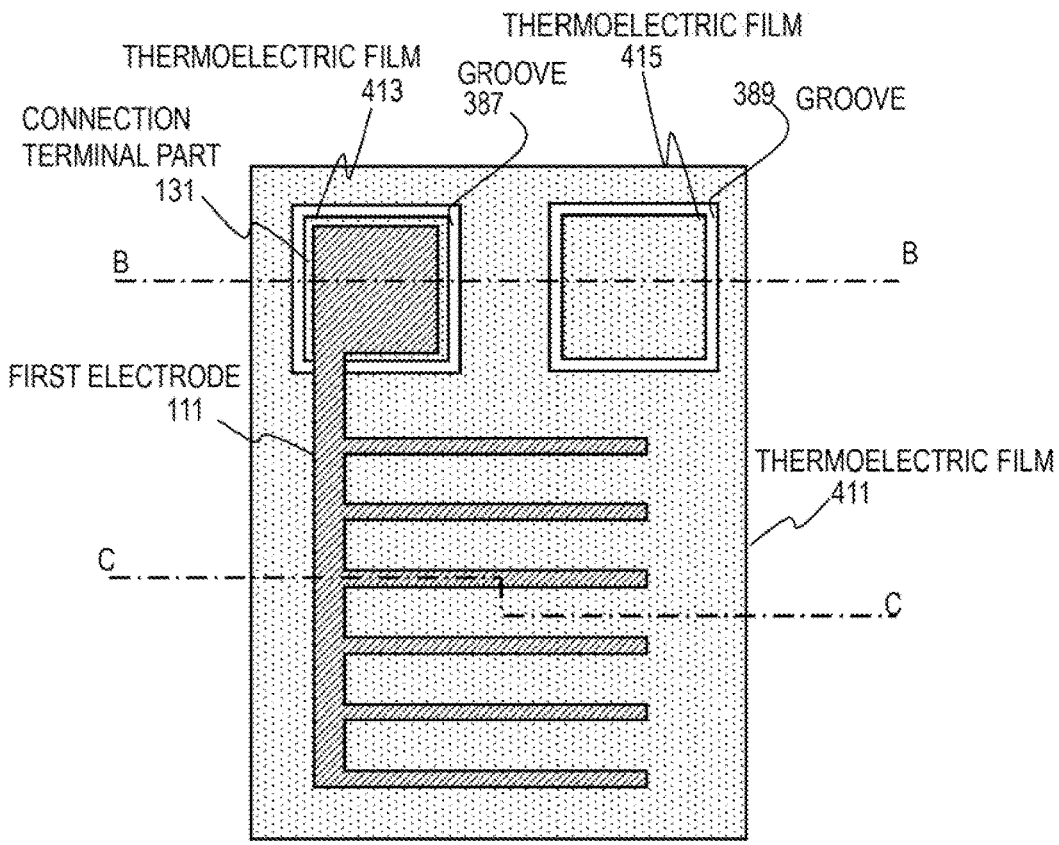
FIG. 37A is a plan diagram of a structure in manufacturing a thermoelectric transducer.
Figure 37B:
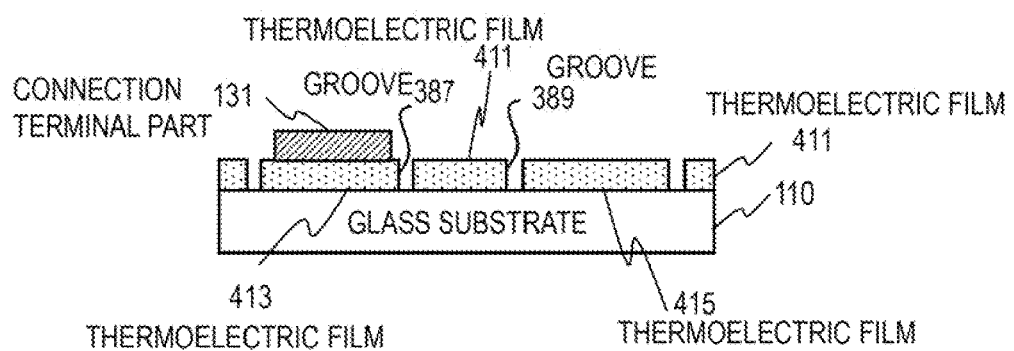
FIG. 37B schematically illustrates the cross-sectional structure along the section line B-B in FIG. 37A.
Figure 37C:
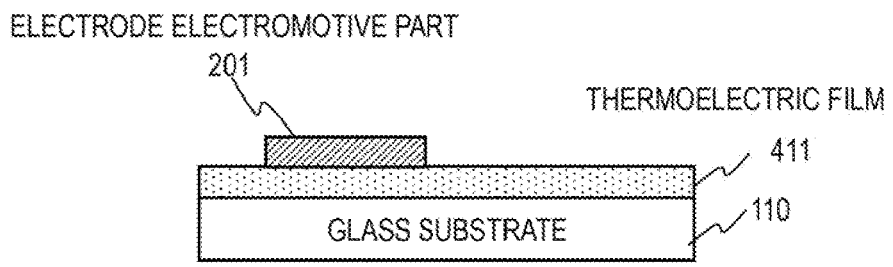
FIG. 37C schematically illustrates the cross-sectional structure along the section line C-C in FIG. 37A.

FIGS. 37A, 37B, and 37C are a plan diagram and two cross-sectional diagrams of the structure after the next step.

This step produces a first electrode 111. The cross-sectional diagram of FIG. 37B illustrates the cross-section along the section line B-B in FIG. 37A, which is a cross-section of the area where a connection terminal part 131 is formed. The cross-sectional diagram of FIG. 37C illustrates the cross-section along the section line C-C in FIG. 37A, which is a cross-section of the area where an electromotive part 201 is formed. The connection terminal part 131 is formed on the thermoelectric film 413. The first electrode 111 can be produced by the same method as the one in Embodiment 1.

Figure 38A:
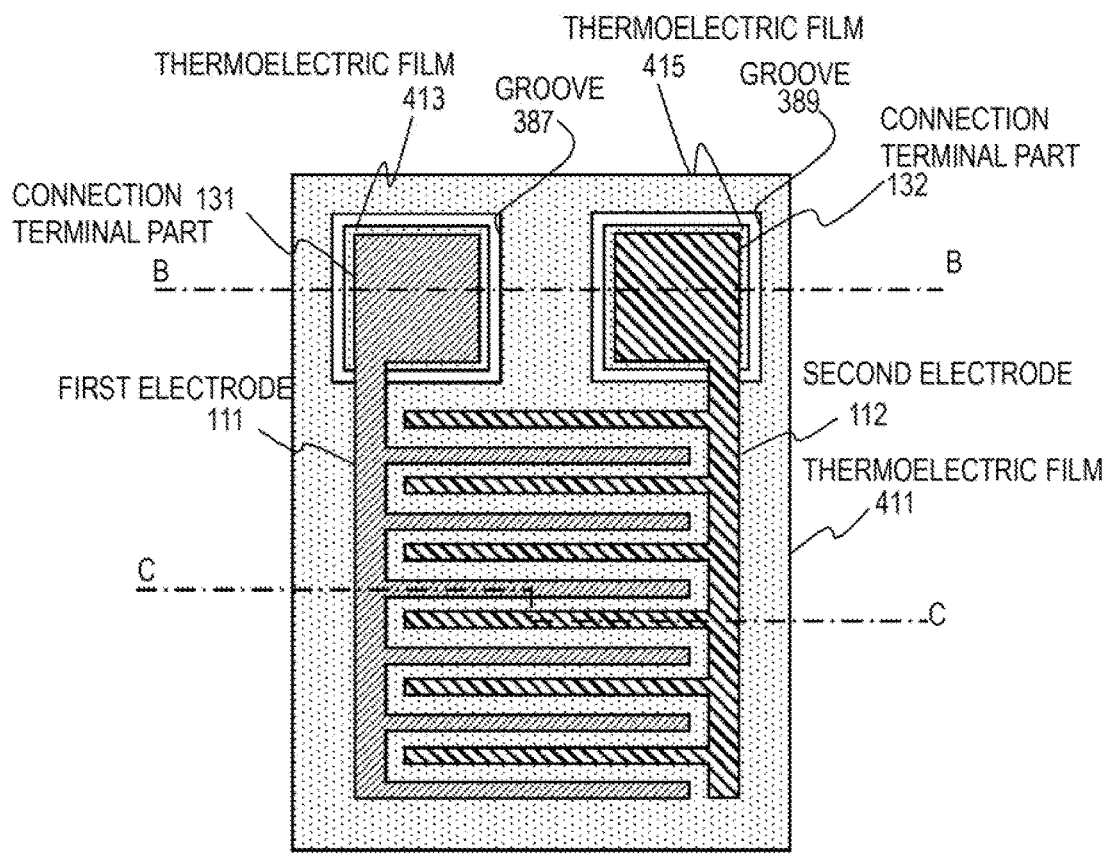
FIG. 38A is a plan diagram of a structure in manufacturing a thermoelectric transducer.
Figure 38B:
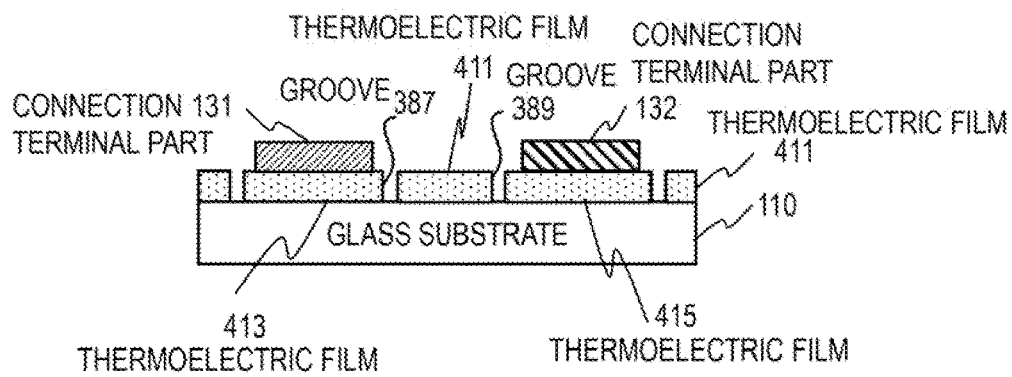
FIG. 38B schematically illustrates the cross-sectional structure along the section line B-B in FIG. 38A.
Figure 38C:
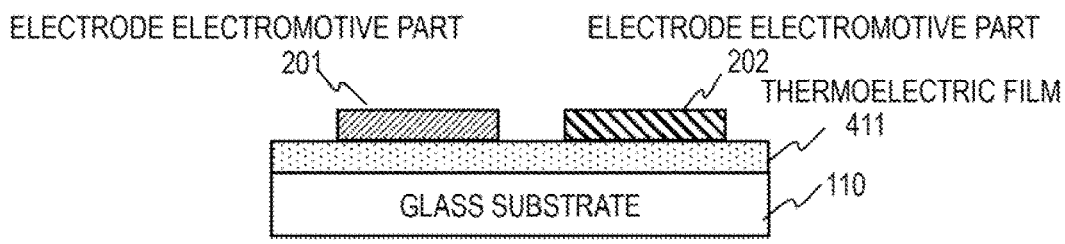
FIG. 38C schematically illustrates the cross-sectional structure along the section line C-C in FIG. 38A.

FIGS. 38A, 38B, and 38C are a plan diagram and two cross-sectional diagrams of the structure after the next step. This step produces a second electrode 112. The cross-sectional diagram of FIG. 38B illustrates the cross-section along the section line B-B in FIG. 38A, which is a cross-section of the area where a connection terminal part 132 is formed. The cross-sectional diagram of FIG. 38C illustrates the cross-section along the section line C-C in FIG. 38A, which is a cross-section of the area where an electromotive part 202 is formed. The connection terminal part 132 is formed on the thermoelectric film 415. The second electrode 112 can be produced by the same method as the first electrode 111.

The description about the relation between the thermoelectric film and a connection terminal part in Embodiments 4 to 6 is applicable to a thermoelectric transducer on a flexible substrate in place of a glass substrate.

Embodiment 7

For the manufacture of a device 15 using thin-film process including vacuum vapor deposition, sputtering, and/or photolithography, how many devices are taken out from one substrate is an important issue from the viewpoint of cost. The thermoelectric transducer module discussed in this description needs to have a region for performing thermoelectric conversion, lead wires for transmitting the output to an external measurement equipment, a substrate for holding them, and coverings of the lead wires for practical use.

Among those components, the region where the component is required to be manufactured by thin-film process is the region for performing thermoelectric conversion, or the region where a thermoelectric film and two electrodes are layered. The lead wires can be manufactured easily at a lower cost by a method other than the thin-film process and therefore, connecting the lead wires to complete a device is appropriate from the viewpoint of efficiency. The region to be manufactured by thin-film process includes electromotive parts for performing thermoelectric conversion and connection terminal parts to be connected with external lead wires. The electromotive part and the connection terminal part of one electrode are connected via a short lead part and these parts are manufactured integrally.

The foregoing embodiments have described structures based on this concept; however, such structures could have a problem in some conditions of use. One of such conditions is that the tolerance to high temperature is required and another one is that the device is set in a narrow space of an object. In both cases, the proximity of the connection terminal parts to the object region is one cause. In the former condition, the heat tolerance of the joints becomes an issue and in the latter condition, the height of the joints becomes an issue.

As to the materials of the thermoelectric conversion region produced by thin-film process, the thermoelectric film can be an oxide semiconductor film. IGZO has sufficient heat tolerance to the process temperature of approximately 300° C. to 400° C. For the metallic electrodes, Ni has a melting point at 1455° C. Ti has a melting point at 1675° C. It is said that polyimide for the flexible substrate has a decomposition temperature higher than 500° C.

As understood from the above, the materials of the thermoelectric conversion region generally have sufficient heat tolerance to the temperature range from 300° C. to 400° C. However, the structures in which lead wires as independent components are connected with the thermoelectric transducer include joints and therefore, the heat tolerance of the joints determines the heat tolerance of the whole device. The solidus temperature of high-temperature solder is approximately 220° C. and a common anisotropic conductive film (ACF) is not expected to be used in an environment higher than a hundred and several ten degrees Celsius.

In view of the foregoing, this embodiment proposes a high heat-resistive device having long lead regions produced integrally with a thermoelectric conversion region. The whole device down to a region to be placed at temperature tolerable for an external device can be produced integrally, within the limitation of the size of the mother substrate. Alternatively, the connection terminal parts are formed at ends of the lead parts elongated to the region where the heat tolerance of the joints is ensured and the lead wires produced by independent process can be connected to the connection terminal parts.

Figure 39:
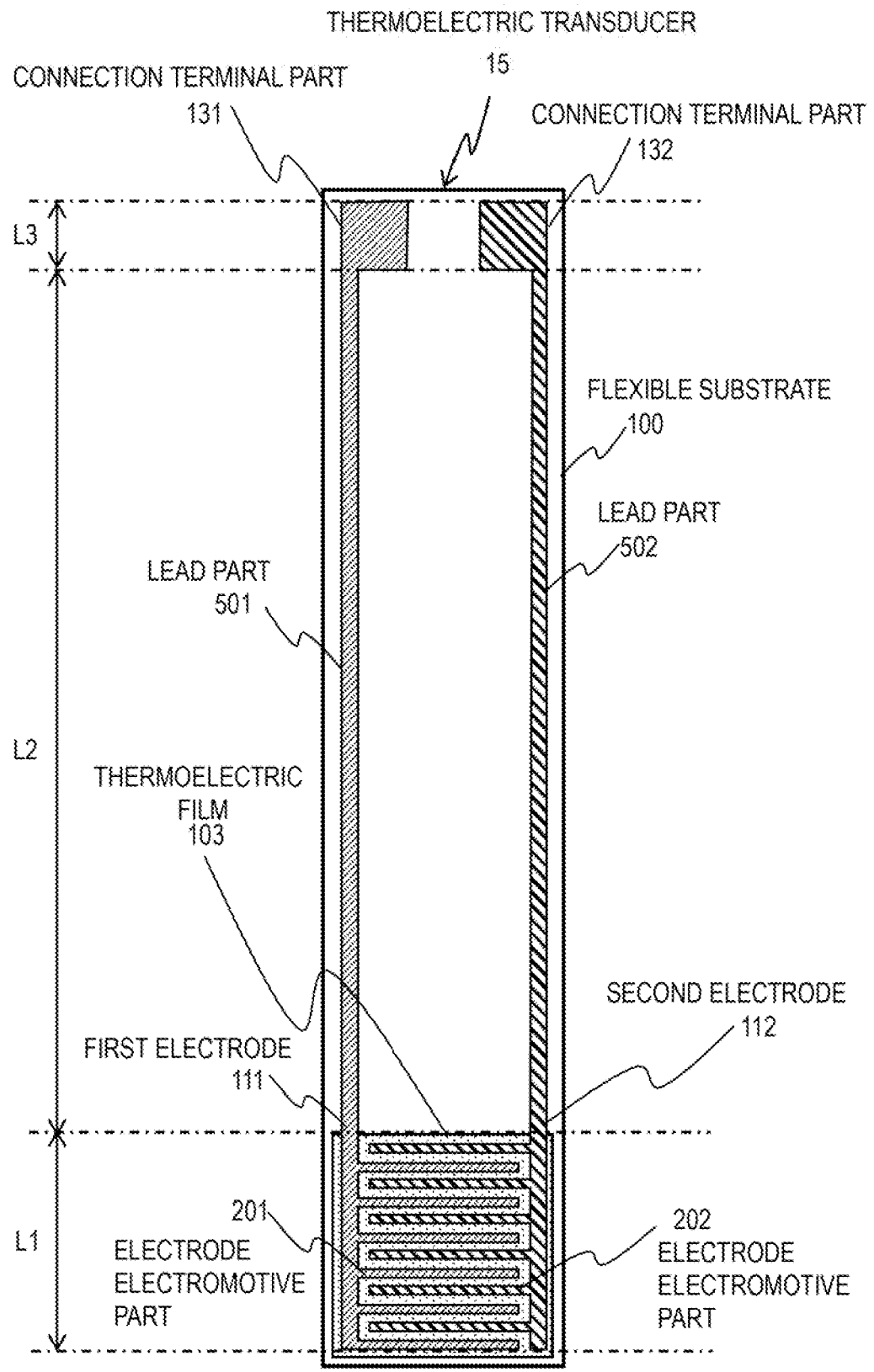
FIG. 39 is a plan diagram of a configuration example of a thermoelectric transducer in Embodiment 7.

FIG. 39 illustrates a configuration example of the thermoelectric transducer 15 in this embodiment. In comparison with the foregoing other embodiments, this thermoelectric transducer 15 has long lead parts between the connection terminal parts and the electromotive parts for performing thermoelectric conversion.

Specifically, the first electrode 111 and the second electrode 112 have long lead parts 501 and 502, respectively, compared to those in Embodiment 1. Like in Embodiment 1, the connection terminal part 131, the lead part 501, and the electromotive part 201 are formed integrally and included in a first electrode 111 of one conductive film. In similar, the connection terminal part 132, the lead part 502, and the electromotive part 202 are formed integrally and included in a second electrode 112 of one conductive film.

As illustrated in FIG. 39, the length L2 of the lead parts 501 and 502 is longer than both of the length L1 of the thermal electromotive part and the length L3 of the connection terminal parts 131 and 132. The length of a lead part is defined by the distance between the thermal electromotive part and a connection terminal part at the points where the thermal electromotive part and the connection terminal part are closest to each other. The lengths of the thermal electromotive part and the connection terminal part are their largest dimensions in the direction parallel to the length of the lead part. The two lead parts can have different lengths and the shorter lead part is longer than both of the thermal electromotive part and the connection terminal part. In the example of FIG. 39, the two lead parts 501 and 502 are straight and parallel to each other, these parts can be bent.

In the configuration in FIG. 39, the thermoelectric film 103 is provided only in the thermal electromotive part where the electromotive parts 201 and 202 are laid on the thermoelectric film 103 and is not provided in the regions corresponding to the lead parts 501 and 502 and the connection terminal parts 131 and 132 that are formed integrally with the electromotive parts 201 and 202. The outer edge of the thermoelectric film 103 is located inner than the outer edge of the flexible substrate 100. On the side of the flexible substrate 100 where the device is fabricated, a protection layer such as a polyimide layer can be provided in the region excluding the regions of the connection terminal parts 131 and 132. The manufacturing procedure can be the same as the one in Embodiment 1.

This configuration achieves a device (thermoelectric transducer module) thin in the region to be attached to an object and highly resistive to heat. Furthermore, the device is free from the effect of a parasitic device between a lead wire and the thermoelectric film to attain proper output.

The foregoing embodiments have described interconnection by soldering as a typical example; however, in the cases of wire bonding, compression bonding, diffusion joining, ACF, and conductive adhesive, the joint may penetrate the thin-film electrode so that a lead wire or a connection terminal could directly contact the thermoelectric film. Therefore, the same configurations in the foregoing embodiments are effective to stabilize the characteristics of the device.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A thermoelectric transducer comprising:
   a substrate;
   a thermoelectric film on the substrate;
   a first electrode on the substrate; and
   a second electrode on the substrate, the second electrode being different from the first electrode in work function,
   wherein the first electrode and the second electrode are in contact with a same side of the thermoelectric film,
   wherein the first electrode includes a first connection terminal part for supplying an output voltage outside of the substrate,
   wherein the second electrode includes a second connection terminal part for supplying an output voltage outside of the substrate,
   wherein the first connection terminal part and the second connection terminal part are distant from the thermoelectric film when viewed planarly,
   wherein the thermoelectric film is a first thermoelectric film,
   wherein the thermoelectric transducer further comprises:
      a first island-like thermoelectric film located on the same layer as the first thermoelectric film but distant from the first thermoelectric film; and
      a second island-like thermoelectric film located on the same layer as the first thermoelectric film but distant from the first thermoelectric film,
   wherein the first thermoelectric film is located between the substrate and both of the first electrode and the second electrode, and
   wherein the first connection terminal part and the second connection terminal part are laminated in contact with the first island-like thermoelectric film and the second island-like thermoelectric film, respectively, and
   wherein an outer edge of the thermoelectric film is located inner than an outer edge of the substrate.

2. The thermoelectric transducer according to claim 1, wherein the first electrode and the second electrode are located between the thermoelectric film and the substrate.

3. The thermoelectric transducer according to claim 1, wherein the substrate is a flexible substrate,
   wherein the first electrode includes a first lead part being distant from the thermoelectric film when viewed planarly, between the first connection terminal part and the part in contact with the same side of the thermoelectric film, and
   wherein the second electrode includes a second lead part being distant from the thermoelectric film when viewed planarly, between the second connection terminal part and the part in contact with the same side of the thermoelectric film.

\* \* \* \* \*